US006728925B2

(12) United States Patent
Ishiwatari et al.

(10) Patent No.: US 6,728,925 B2
(45) Date of Patent: *Apr. 27, 2004

(54) ERROR CORRECTING METHOD AND APPARATUS

(75) Inventors: Junichi Ishiwatari, Kanagawa (JP); Atsuki Taniguchi, Kanagawa (JP); Masahiro Shioda, Kanagawa (JP); Takashi Kuwabara, Kanagawa (JP); Yukio Yamazaki, Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/318,664

(22) Filed: May 25, 1999

(65) Prior Publication Data

US 2003/0061562 A1 Mar. 27, 2003

(30) Foreign Application Priority Data

Sep. 21, 1998 (JP) ............................... 10-266660

(51) Int. Cl.[7] ................................................ H03M 13/00
(52) U.S. Cl. ........................................ 714/777; 714/776
(58) Field of Search ................................. 714/777, 758, 714/776; 370/395.51

(56) References Cited

U.S. PATENT DOCUMENTS

| | | | | | |
|---|---|---|---|---|---|
| 4,491,943 A | * | 1/1985 | Iga et al. | .................... | 370/511 |
| 4,630,272 A | * | 12/1986 | Fukami et al. | .............. | 714/755 |
| 4,953,168 A | * | 8/1990 | Odaka | ......................... | 714/755 |
| 5,124,986 A | * | 6/1992 | Sudoh et al. | ............... | 714/704 |
| 5,287,468 A | * | 2/1994 | Furuhashi et al. | .............. | 710/5 |
| 5,432,613 A | * | 7/1995 | Lee | ............................. | 386/112 |
| 5,502,734 A | * | 3/1996 | Kashida | ........................ | 714/755 |
| 5,574,717 A | * | 11/1996 | Tomizawa et al. | ........... | 370/244 |
| 5,764,651 A | * | 6/1998 | Bullock et al. | .............. | 714/708 |
| 5,930,273 A | * | 7/1999 | Mukojima | .................... | 714/776 |
| 6,101,625 A | * | 8/2000 | Higashi | ....................... | 714/776 |
| 6,185,717 B1 | * | 2/2001 | Fukunaga et al. | .......... | 714/777 |
| 6,239,889 B1 | * | 5/2001 | Harley et al. | ................ | 359/124 |

FOREIGN PATENT DOCUMENTS

| | | | | |
|---|---|---|---|---|
| EP | 1130838 A2 | * 9/2001 | ............. | H04L/1/00 |
| JP | 9-130355 | 5/1997 | | |
| JP | 9130355 | 5/1997 | | |

OTHER PUBLICATIONS

ITU–T Recommendation G.975, "Forward Error Correction for Submarine Systems", Series G: Transmission Systems and Media, Digital Systems and Networks, Telecommunications Standardization of ITU, 11/96.*

(List continued on next page.)

*Primary Examiner*—Albert Decady
*Assistant Examiner*—Joseph D. Torres
(74) *Attorney, Agent, or Firm*—Katten Muchin Zavis Rosenman

(57) ABSTRACT

In an error correcting method and an apparatus therefor using Hamming codes, a frame regulated by a synchronous network is divided into L blocks in the direction of row. Preferably, information bits and check bits are allocated to a payload portion and non-defined bits of an LOH portion, respectively. More preferably, the information bits and the check bits are divided into M sub blocks to form a Hamming code block. In addition, a code error correcting means rearrange each Hamming code block per bit and further preferable, a syndrome register with a plurality of banks operates an error syndrome of the Hamming code block, and based on the operation result, the code error correction of the Hamming code block is performed by a bank switchover.

19 Claims, 23 Drawing Sheets

OTHER PUBLICATIONS

H.R. Salloum and S. Yoneda, "B–ISDN user network interface: implementation of performance monitoring functions using SONET overhead", Conference Record 1990 IEEE International Conference on Communications Including Supercomm Technical Sessions, SUPERCOMM/I.*

R. Ballart and Y.–C. Ching, "SONET: now it's the standard optical network", IEEE Communications Magazine, vol.: 27, Issue: 3, Mar. 1989 Page(s): 8–15.*

W.D. Grover and T.E. Moore, "Design and characterization of an error–correcting code for the SONET STS–1 tributary", IEEE Transactions on Communications, vol.: 38, Issue: 4, Apr. 1990, Page(s): 467–476.*

Grover, W.D.; Moore, T.E.; Design and characterization of an error–correcting code for the SONET STS–1 tributary; IEEE Transactions on Communications; vol.: 38 Issue: 4, Apr. 1990; Page(s): 467–476.*

A Forward Error Correcting Scheme for SONET 10Gb/s Optical Transmission system. Alcatel Network Systems, Jul. 12, 1994.

Design and Characterization of an Error–Correcting Code for the SONET STS–1 Trubutary, Wayne D. Grover, Member, IEEE, and Thomas E. Moore, Member, IEEE, IEEE Transactions on Communications, vol. 38, No. 4, Apr. 1990.

Series G: Transmission Systems and Media, Digital Systems and Networks—Digital transmission systems—Digital sections and digital line system—Optical fibre submarine cable systems–Forward error correction for submarine systems—ITU–T Recommendation G.975.

* cited by examiner

FIG. 11

|      | a | b | c | d | e | f | g | h | i | j | k | l |
|------|---|---|---|---|---|---|---|---|---|---|---|---|
| GP 1 | # 1 | # 17 | # 33 | # 49 | # 65 | # 81 | # 97 | #113 | #129 | #145 | #161 | #177 |
| GP 2 | # 9 | # 25 | # 41 | # 57 | # 73 | # 89 | #105 | #121 | #137 | #153 | #169 | #185 |
| GP 3 | # 2 | # 18 | # 34 | # 50 | # 66 | # 82 | # 98 | #114 | #130 | #146 | #162 | #178 |
| GP 4 | # 10 | # 26 | # 42 | # 58 | # 74 | # 90 | #106 | #122 | #138 | #154 | #170 | #186 |
| GP 5 | # 3 | # 19 | # 35 | # 51 | # 67 | # 83 | # 99 | #115 | #131 | #147 | #163 | #179 |
| GP 6 | # 11 | # 27 | # 43 | # 59 | # 75 | # 91 | #107 | #123 | #139 | #155 | #171 | #187 |
| GP 7 | # 4 | # 20 | # 36 | # 52 | # 68 | # 84 | #100 | #116 | #132 | #148 | #164 | #180 |
| GP 8 | # 12 | # 28 | # 44 | # 60 | # 76 | # 92 | #108 | #124 | #140 | #156 | #172 | #188 |
| GP 9 | # 5 | # 21 | # 37 | # 53 | # 69 | # 85 | #101 | #117 | #133 | #149 | #165 | #181 |
| GP10 | # 13 | # 29 | # 45 | # 61 | # 77 | # 93 | #109 | #125 | #141 | #157 | #173 | #189 |
| GP11 | # 6 | # 22 | # 38 | # 54 | # 70 | # 86 | #102 | #118 | #134 | #150 | #166 | #182 |
| GP12 | # 14 | # 30 | # 46 | # 62 | # 78 | # 94 | #110 | #126 | #142 | #158 | #174 | #190 |
| GP13 | # 7 | # 23 | # 39 | # 55 | # 71 | # 87 | #103 | #119 | #135 | #151 | #167 | #183 |
| GP14 | # 15 | # 31 | # 47 | # 63 | # 79 | # 95 | #111 | #127 | #143 | #159 | #175 | #191 |
| GP15 | # 8 | # 24 | # 40 | # 56 | # 72 | # 88 | #104 | #120 | #136 | #152 | #168 | #184 |
| GP16 | # 16 | # 32 | # 48 | # 64 | # 80 | # 96 | #112 | #128 | #144 | #160 | #176 | #192 |

F I G. 14
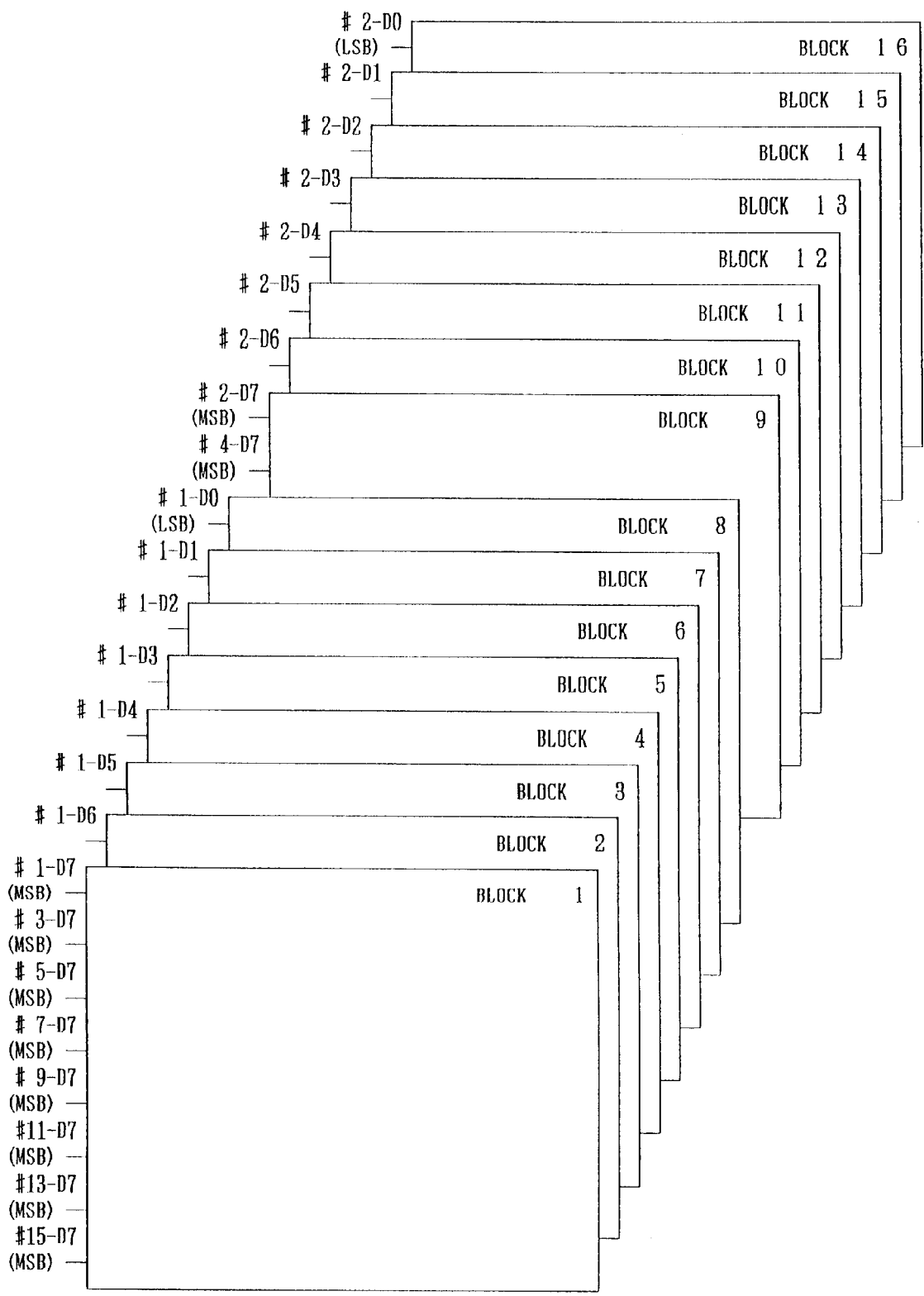

F I G. 2 2 A

TRANSMITTER SIDE

| PROV | Z2#6 OUTPUT |
|---|---|
| FEC | |
| DISABLE "1" | * |
| ENABLE "1" | AAh |

*: NORTH AMERICA ALL "0", CEPT. ALL "1"

F I G. 2 2 B

RECEIVER SIDE

| PROV SETTING | | Z2#6 INPUT | FEC ACTION |
|---|---|---|---|
| COMPULSORY START | PROV | | |
| START "0" | DISABLE "0" | ALL "1" or "0" | OFF |
| START "0" | DISABLE "0" | EXCEPT ALL "1" or "0" | OFF |
| START "0" | ENABLE "1" | ALL "1" or "0" | OFF |
| START "0" | ENABLE "1" | EXCEPT ALL "1" or "0" | ON |
| FINISH "1" | — | — | ON |

FIG.23

| BER | | |
|---|---|---|
| AT FEC-OFF | | AT FEC-ON |
| $1 \times 10^{-3}$ | $\rightarrow$ | $1.008 \times 10^{-3}$ |
| $1 \times 10^{-4}$ | $\rightarrow$ | $9.637 \times 10^{-5}$ |
| $1 \times 10^{-5}$ | $\rightarrow$ | $2.250 \times 10^{-6}$ |
| $1 \times 10^{-6}$ | $\rightarrow$ | $2.481 \times 10^{-8}$ |
| $1 \times 10^{-7}$ | $\rightarrow$ | $2.506 \times 10^{-10}$ |
| $1 \times 10^{-8}$ | $\rightarrow$ | $2.508 \times 10^{-12}$ |
| $1 \times 10^{-9}$ | $\rightarrow$ | $2.509 \times 10^{-14}$ |
| $1 \times 10^{-10}$ | $\rightarrow$ | $2.509 \times 10^{-16}$ |
| $1 \times 10^{-11}$ | $\rightarrow$ | $2.509 \times 10^{-18}$ |
| $1 \times 10^{-12}$ | $\rightarrow$ | $2.509 \times 10^{-20}$ |
| $1 \times 10^{-13}$ | $\rightarrow$ | $2.509 \times 10^{-22}$ |
| $1 \times 10^{-14}$ | $\rightarrow$ | $2.509 \times 10^{-24}$ |
| $1 \times 10^{-15}$ | $\rightarrow$ | $2.509 \times 10^{-26}$ |

ERROR CORRECTING METHOD AND APPARATUS

BACKGROUND OF THE INVENTION

1. Field of the Invention

The present invention relates to an error correcting method and an apparatus therefor, and in particular to a method and an apparatus for performing an error correction of a transmission signal with a Hamming code.

In a long distance transmission line of an optical transmission equipment by way of example, a loss caused by an optical fiber is compensated by the cascade connection of optical amplifiers, while a noise generated at each of the optical amplifiers deteriorates network quality parameters, e.g. a BER (Bit Error Rate).

As an efficient method to solve this problem, an error correcting method and an apparatus therefor are required by a transmitter making a message an error correcting code to be transmitted and a receiver detecting an error bit included in a received message to correct the bit.

2. Description of the Related Art (1) It is known as a prior art error correcting method that for example, in "Design and Characterization of an Error-Correction Code for the SONET STS-1 Tributary" published in the IEEE TRANSACTIONS ON COMMUNICATION. VOL.38. NO.4 APRIL 1990, a Forward Error Correction (hereinafter occasionally abbreviated as FEC) is performed with a TOH portion (an SOH portion, an LOH portion) and a payload portion except the LOH portion within a single frame being allotted for an operation area by using a shortened Hamming code, and with Z3 and Z4 byte portions in a POH portion being allotted for check bits.

(2) Additionally, in "A forward error correcting scheme for SONET 10 Gb/s Optical Transmission system" published in the T1X1.5/94–148 July $12^{th}$ 1994 (ALCATEL NETWORK SYSTEM), the FEC is performed with the LOJ portion except the SOH portion and the payload portion within a single frame being allotted for the operation area by using the shortened Hamming code, with a single frame being divided into three, i.e. $9^{th}$, $1^{st}$, $2^{nd}$ rows, $3^{rd}$–$5^{th}$ rows, and $6^{th}$–$8^{th}$ rows, with the check bits of the $9^{th}$, $1^{st}$ and $2^{nd}$ rows being allotted for a D3 byte portion of the SOH portion, with the check bits of the $3^{rd}$–$5^{th}$ rows being allotted for a D6 byte portion of the LOU portion, and with the check bits of the $6^{th}$–$8^{th}$ rows being allotted for an E2 byte portion of the LOH portion.

(3) Moreover, in "FORWARD ERROR CORRECTION FOR SUBMARINE SYSTEMS" published in the ITU-T (TELECOMMUNICATION STANDARDIZATION SECTION OF ITU) Recommendation G.975 (11/96), the FEC is performed with the whole of a single frame being allotted for the operation area by using an RS (Reed-Solomon) code, and with an increased part of a transmission speed being allotted for the check bits.

(4) Furthermore, in an error correcting/encoding method and a transmitter/receiver apparatus published in the Japanese Patent Publication Laid-open No.9-130355, the FEC is performed with the payload portion except the TOH portion within a single frame being allotted for the operation area by using the RS code, with a single frame being divided into two, and with non-defined byte portions in the LOH portion being allotted for the check bits.

By the error correcting method (1), since at least a single frame has to be held in a memory once, a transfer delay becomes 139 μseconds (=125 μseconds×900 bytes/810 bytes). This value does not satisfy the standard of transfer delay, i.e. equal to or less than 100 μseconds prescribed by ANSI T1.506A-1992, Telecommunication Performance-Specifications for Switched Exchange Network (Absolute, Round-trip Delay), ANSI T1.508-1992.

Also, by the error correcting method (2), since the SOH is used for the check bits and the SOH is terminated in case that a regenerator or relaying equipment is positioned on a transmission line, the FEC can not be performed.

Moreover, by the method (3), since the transmission speed is increased for the addition of the check bits, the apparatus executing this method is not based on the SONET and therefore an SDH is only used in an isolated state from the world standard.

Generally, what kind of error correcting codes can efficiently perform the error correction depends on an error occurrence pattern on a transmission equipment, a system, and a transmission line.

The error correcting methods (3) and (4) use the RS code. The RS code is suitable for the system where a burst error is generated. When the RS code is adopted for such a system, the BER is highly improved as compared with the case of the Hamming code.

However, the RS code requires a memory on the transmitter side and enlarges a circuit scale. Furthermore, assuming that the number of bits in one character is "n", the RS code notifies that the number of errors is "1" in case the number of error bits is any one of 1 to n. Accordingly, the RS code can not accurately count the number of error bits.

Moreover, by the method (4), the transmission speed is an integer times of 622.08 Mb/s. In this case, compared with the case using the Hamming code, the higher the transmission speed, the larger the difference of both circuit scales.

In an optical transmission equipment or the like, it is required that the deterioration of BER by an optical amplifier is prevented and the frequency of switchover by an SD (Signal Degrade: a random error of $1 \times 10^{-2}$–$10^{-9}$ rate) is decreased.

Generally, the Hamming code is suitable for a random error correction, and can accurately notify the number of corrected bits. The circuit scale for the Hamming code is smaller compared with that for the RS code since on the transmitter side of the CRC operation of information bits is performed and the result only has to be inserted into the check bits, eliminating any need of memory.

SUMMARY OF THE INVENTION

It is accordingly an object of the present invention to provide an error correcting method and an apparatus therefor using a Hamming code wherein the transfer delay is reduced, the BER is improved, and the circuit is small-scaled.

In order to achieve the above-mentioned object, an error correcting method according to the claim 1 divides a frame prescribed for a synchronous network into L Hamming code blocks, where L is a natural number ≦9, in a direction of row and allots information bits and check bits to each of the blocks.

Namely, the Hamming code is required to temporarily hold all of the information on a receiver side when an error correction is performed. The transfer delay is caused for the holding time. By dividing a single frame into L Hamming code blocks and making the size of a single Hamming code block 1/L of a single frame, the transfer delay is reduced.

In the present invention according to the claim 2, the synchronous network may comprise SONET or SDH, and the frame may comprise an STS-N frame, an OC-N frame, or an STM-N frame.

Namely, the synchronous network may be either the SONET or the SDH, and the frame may adopt either the STS-N frame or the OC-N frame prescribed by the SONET, or may adopt the STM-N frame prescribed by the SDH.

In the present invention according to the claim 3, the information bits and the check bits may be allotted to a payload portion of the frame and non-defined bits of an LOH portion, respectively.

Namely, the information bits are allotted to the payload portion, while they are not allotted to the SOH portion and the LOH portion including B1 and B2 byte portions which have a possibility of being rewritten during transmission. The check bits are allotted to the non-defined bits of the LOH portion, while they are not allotted to the SOH portion terminated in a relaying equipment. Accordingly, an FEC can be performed without the Hamming code blocks being rewritten during transmission and being terminated at the relaying equipment.

In the present invention according to the claim 4, the information bits and the check bits may be further divided into M subblocks, where M is a natural number$\geq 2$, to compose the Hamming code block having a single subblock of the information bits and the check bits.

Namely, the Hamming code blocks composed of the information bits and the check bits are divided into M subblocks. L×M subblocks are made to the Hamming code blocks, and a code length, i.e. information bit number can be shortened.

As a result, it becomes possible to make simple the composition of a primitive polynomial for selecting a generation polynomial required on transmitter/receiver sides with fewer degrees, for e.g. an easy simulation.

In the present invention according to the claim 5, the information bits and the check bits may be rearranged per bit over each of the Hamming code blocks in order that an error correction of sequential M bits is made.

Namely, the Hamming code is suitable for a random error correction, so that only a single bit error within a single Hamming code block can be corrected. Accordingly, a burst or sequential bit error can not be corrected.

For this reason, burst error bits generated in a single Hamming code block are to be scattered into M Hamming code blocks. Namely, the information bits and the check bits are respectively rearranged in order that only a single or null error bit may exist in each of the Hamming code blocks.

As a result, it becomes possible to correct the burst error bits of sequential M bits, further improving the BER.

Moreover, in order to achieve the above-mentioned object, an error correcting apparatus according to the claim 6 may comprise a code error correcting means for dividing a frame prescribed for a synchronous network into L Hamming code blocks, where L is a natural number$\leq 9$, in a direction of row and for allotting information bits and check bits to each of the blocks.

Namely, when the error is corrected on the receiver side, the Hamming code requires a shift register which temporarily holds block information of a single Hamming code. The transfer delay is caused for the holding time.

Therefore, by dividing a single frame into L Hamming code blocks and making the size of a single Hamming code block 1/L of a single frame, it becomes possible to small-scale the circuit and to reduce the transfer delay.

In the present invention according to the claim 7, the synchronous network may comprise SONET or SDH, and the frame may comprise an STS-N frame, an OC-N frame, or an STM-N frame.

In the present invention according to the claim 8, the code error correcting means may allot the information bits and the check bits to a payload portion of the frame and non-defined bits of an LOH portion, respectively.

Namely, small-scale and identical circuits for the Hamming code only have to be required for allotting the information bits to the payload portion divided into L, and even when there is the relaying equipment on a transmission line, the FEC can be performed by allotting the check bits to the non-defined bits not of the SOH portion which is terminated in the relaying equipment but of the LOH portion.

Namely, the information bits are allotted to the payload portion but neither to the SOH portion nor LOH portion including the B1 and B2 byte portions which have a possibility of being rewritten during the transmission. The check bits are allotted to the non-defined bits of the LOH portion, but not to the SOH portion terminated in the relaying equipment. Accordingly, the FEC can be performed without the Hamming code blocks being rewritten during the transmission and being terminated at the relaying equipment.

In addition, since the information bits are divided into L and are allotted to the payload portion, the circuits which process the payload portion can be used as L equivalent processing circuits.

In the present invention according to the claim 9, L may be equal to 3, and the code error correcting means may allot three blocks of 9th, 1st, 2nd rows, 3rd–5th rows, and 6th–8th rows in the payload portion to the Hamming code blocks and may allot the check bits of each Hamming code block to K1, D5 and Z2 byte portions which are the non-defined bits in the LOH portion.

Namely, the payload portion is divided into three blocks, i.e. 9th, 1st, 2nd rows, 3rd–5th rows, and 6th–8th rows. These three Hamming code blocks are composed of the information bits allotted to each of the blocks and the check bits allotted to the K1 byte portion of the 5th row, the D5 byte portion of the 6th row, and the Z2 byte portion of the 9th row in the LOH portion.

By allotting the Hamming code blocks in this way, the receiver side can perform a code error correction only with a memory for five rows at the maximum. The transfer delay is 69.4 $\mu$seconds (=125 $\mu$seconds×5 rows/9 rows), which satisfies the above-mentioned standard, i.e. equal to or less than 100 $\mu$seconds.

In the present invention according to the claim 10, the code error correcting means may divide the information bits and the check bits into M subblocks, where M is a natural number$\geq 2$, to generate the Hamming code blocks having the Hamming code to compose a single subblock of the information bits and the check bits.

Namely, the Hamming code blocks are remade by dividing the Hamming code blocks composed of the information bits and the check bits into M subblocks, thereby shortening the code length of a single Hamming code block.

As a result, it becomes possible to make simple the composition of a primitive polynomial for selecting a generated polynomial required on the transmitter/receiver sides with fewer degrees and to small-scale the circuit for an easy simulation.

In the present invention according to the claim 11, the code error correcting means may include data exchanging means for rearranging the information bits and the check bits per bit over each of the Hamming code blocks in order that an error correction of sequential M bits is made.

Namely, the data exchange means rearrange sequential M burst error bits generated in a sequential single Hamming code block in order that each of M Hamming code blocks may have a single bit of the error bits. Accordingly, the error bit of each Hamming code block is a single bit at most so that the error correction is made possible.

As a result, the burst error bits correction of sequential M bits can be performed and the BER can be improved.

In the present invention according to the claim 12, the code error correcting means may include syndrome registers, composed of a plurality of banks, which divide a received Hamming code message per the Hamming code block, operate a syndrome of each Hamming code block, and make a code error correction of each Hamming code block based on the operation result by changing the banks.

Namely, the syndrome registers read the information bits and the check bits of the received Hamming code block to operate the syndrome. Based on the operation result, the error bits included in the Hamming code blocks are corrected.

Accordingly, a start time for processing the next Hamming code block is delayed with single syndrome registers, which makes it difficult to follow the transmission speed of frame.

For this reason, the syndrome registers composed of a plurality of banks is prepared. The received Hamming code message is divided per a Hamming code block, and the syndrome registers sequentially operate the syndrome of each Hamming code block in parallel to hold the result.

Based on the operation result, the code error correction of each Hamming code block can be performed. The syndrome registers having completed a series of these operations successively shift to the processing of the next Hamming code block.

As a result, the transfer delay of the frame can be reduced.

In the present invention according to the claim 13, the code error correcting means may include syndrome registers which operate the check bits by sequentially repeating searches for output states in parallel at a time t+x from an information vector and the output state at a time t, with the information vector at each time being formed of sequential x transmitting information bits of a transmitting message.

In the present invention according to the claim 14, the code error correcting means may include syndrome registers which operate a syndrome by sequentially repeating searches for output states in parallel at a time t+x from an information vector and the output state at a time t, with the information vector at each time being formed, every x bits, of a received Hamming code message.

Namely, on both of the receiver and transmitter sides, the syndrome registers are assumed to have a parallel input and a parallel output. Sequential x bits of the transmission message are converted into parallel data per time interval x as an information vector of the time t.

From this information vector and the output states of the syndrome registers at the time t, the output states of the syndrome registers at the time t+x are operated to latch the result of the operation in the syndrome registers with the timing of t+x. By repeating these operations, the check bits or the syndrome is outputted in parallel to the output terminals of the syndrome registers.

Namely, the processing of converting the transmission message into the error correcting code or of performing the error correction of the received message can be performed for x bits in parallel.

As a result, by delaying the processing speed of the frame with a high transmission speed up to the speed applied to an LSI used for the error correcting code, an operation margin of the LSI can be secured.

In the present invention according to the claim 15, the code error correcting means may include syndrome registers which can correct a single bit error of the received Hamming code message and detect an even bit error, and detecting means for outputting a single bit error correcting signal and an even bit error detecting signal.

Namely, the syndrome registers are composed in order that a single bit error correction and an even bit error detection for the received Hamming code message may be performed. The detecting means output a signal indicating that a single bit error correction has been performed and even bit errors have been detected based on the output signals of the syndrome registers.

As a result, the error bit number occurred in the Hamming code can be counted, enabling to recognize how the BER is improved.

In the present invention according to the claim 16, the code error correcting means may further include encoding setting means which designate a start and a finish of a Hamming-encoding on the transmitter side.

Basically, the FEC functions on the transmitter/receiver sides are required to operate in cooperation with each other.

In addition, when the receiver side has no FEC function, the FEC function on the transmitter side is required to be set as "finish". When the encoding setting means designate the "finish" for Hamming-encoding, the code error correcting means do not perform the FEC operation to fulfill the requirements.

In the present invention according to the claim 17, the encoding setting means set predetermined non-defined byte portion of an LOH portion to an eigen value when the start of the Hamming-encoding is designated, and sets the check bits to all "0" or all "1" when the finish thereof is designated.

Namely, it is required on the transmitter side to notify the receiver side whether or not the transmitted message is Hamming-encoded. If it is the case, the transmitter side notifies the receiver side of the Hamming-encoding by transmitting the fixed non-defined byte portion in the form of the eigen value.

In addition, there is a fixed standard in which non-used byte portion have to be set to either all "0" or all "1". In accordance with this fixed standard, for the case of the "finish" designating that the Hamming-encoding is not performed, the check bits can be set to either all "0" or all "1" designated by the standard.

In the present invention according to the claim 18, the code error correcting means may include decoding setting means which designate a start or a finish of decoding the Hamming code on the receiver side.

Namely, when the transmitter side has no FEC function or when the message is transmitted without Hamming-encoding, it is required that the FEC function is not performed on the receiver side. Therefore, the decoding setting means designate the finish of decoding to fulfill the requirement.

In the present invention according to the claim 19, the decoding setting means may include means for designating a start and a finish of decoding action with either a compulsory start or a compulsory finish, and starts a decoding action only when the designation is the compulsory start or the compulsory finish, the value of the check bits is neither all "1" nor all "0", and the predetermined non-defined byte portion of the LOH portion have an eigen value.

Namely, when examining the apparatus, a forced setting of the start of the FEC function is required.

For this requirement, when the decoding setting means designate the forced start, the FEC function is performed to enable the examination.

In addition, when the forced finish is designated on the contrary, the decoding is performed only when the check bits are neither all "0" nor all "1" indicating that the check bits are not used, that is indicating that the Hamming-encoding is not performed to the message, and predetermined non-defined bits of the LOH portion has an eigen value indicating that the Hamming-encoding is performed.

In the present invention according to the claim 11, the code error correcting means may include means for a BIP-Nx24 operation by B2 byte information of an LOH portion after Hamming-encoding a transmitting message.

When the transmitter side has the FEC function and the receiver side has no FEC function and the FEC function on the transmitter side is mistakenly performed, an error occurs on the receiver side in order of the FEC function and the B2 byte function on the transmitter side.

For example, when the FEC function is performed after the B2 byte operation, a B2 byte error occurs when the B2 byte operation is performed without performing the FEC function on the receiver side because FEC error correcting bytes are included in the operation range of the B2 byte portion.

For this reason, the transmitter/receiver sides solve this problem by performing the B2 operation after the FEC function.

In the present invention according to the claim 12, the code error correcting means may include means for a BIP-Nx24 operation by B2 byte information of an LOH portion after correcting the Hamming code error of a received message.

Namely, after the error correction of the Hamming code of the received message is firstly corrected, the B2 operation of the received message with the error corrected is performed.

As a result, the BER is improved in the B2 operation, so that the number of a line switchover frequency by the SD alarm can be reduced.

BRIEF DESCRIPTION OF THE DRAWINGS

FIG. 11 is a diagram showing an example of a data group in a data converter used in an error correcting method and an apparatus therefor according to the present invention;

FIG. 14 is a diagram showing a block state after a rearrangement in a data converter used in an error correcting method and an apparatus therefor according to the present invention;

FIGS. 22A and 22B are setting tables showing a setting parameter of an FEC portion used in an error correcting method and an apparatus therefor according to the present invention; and FIG. 23 is a table showing a BER improvement efficiency by an FEC portion used in an error correcting method and an apparatus therefor according to the present invention.

Throughout the figures, the same reference numerals indicate identical or corresponding portions.

DESCRIPTION OF THE EMBODIMENTS

Figure 2:
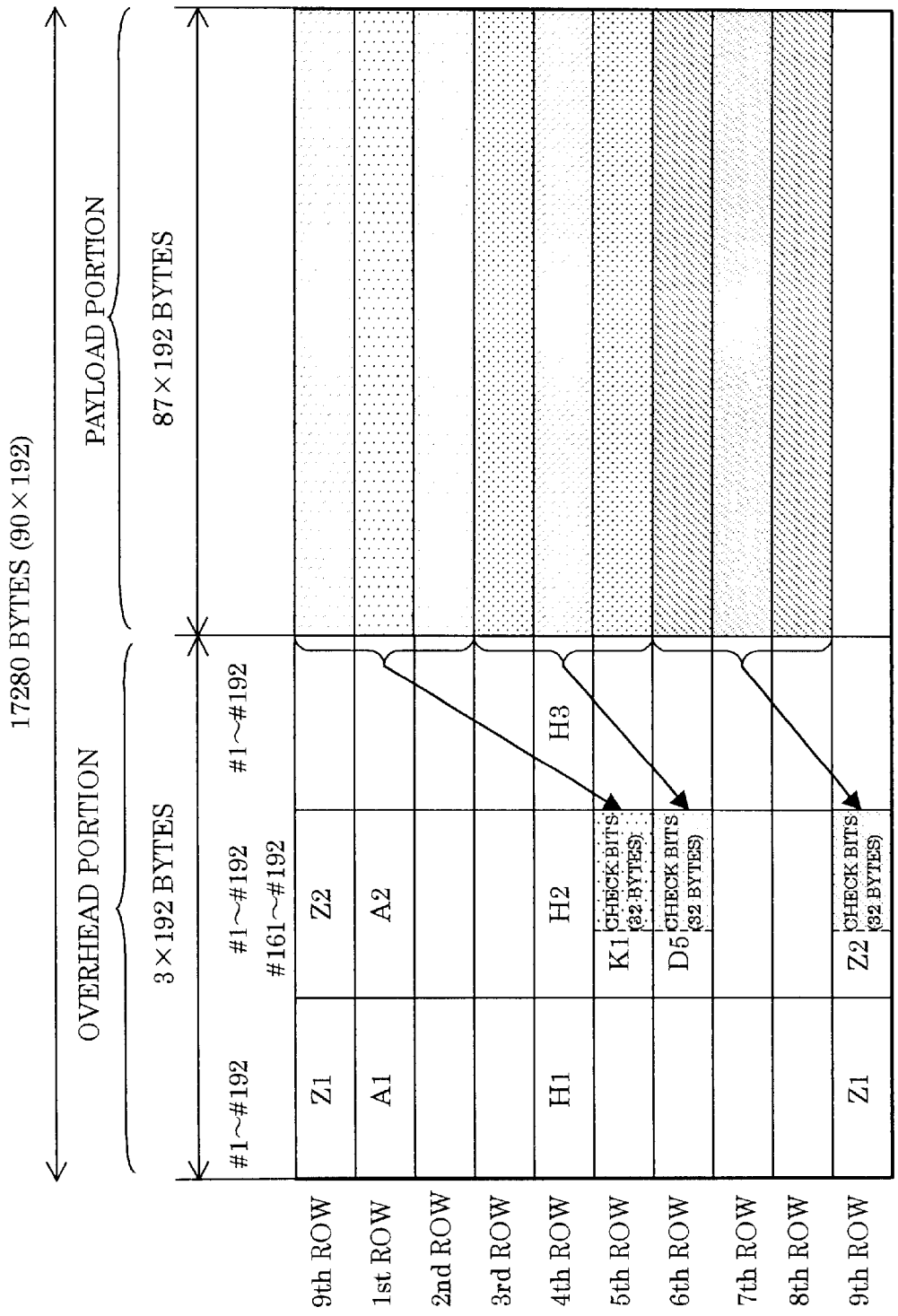
FIG. 2 is a diagram showing an allocation example of error correcting codes in an STS-192 frame used in an error correcting method and an apparatus therefor according to the present invention.

FIG. 2 shows an embodiment of an STS-192 frame used in an error correcting method and apparatus according to the present invention. The payload portion is divided into L, i.e. three information bit blocks with each 50112 bytes (=87 bytes×192×3) of 9th, 1st, 2nd rows, 3rd–5th rows, and 6th–8th rows forming one block, so that K1, D5, and Z2 byte portions consisting of 32 bytes in the LOH portion are respectively allotted to each of the blocks as check bit blocks.

Figure 3:
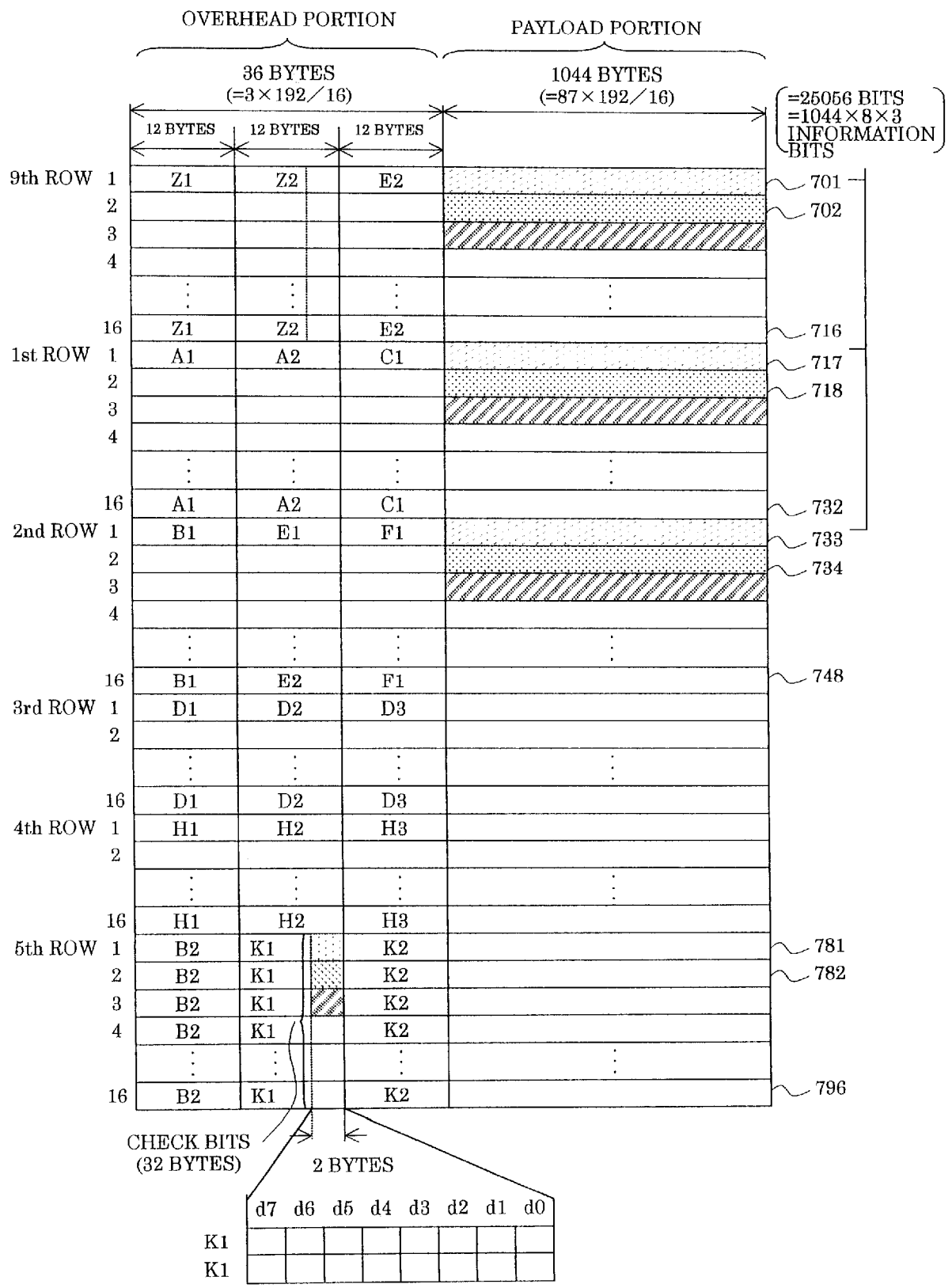
FIG. 3 is a bit map diagram showing an allocation example of a bit allocation (1) of error correcting codes in an STS-192 frame used in an error correcting method and an apparatus therefor according to the present invention.
Figure 4:
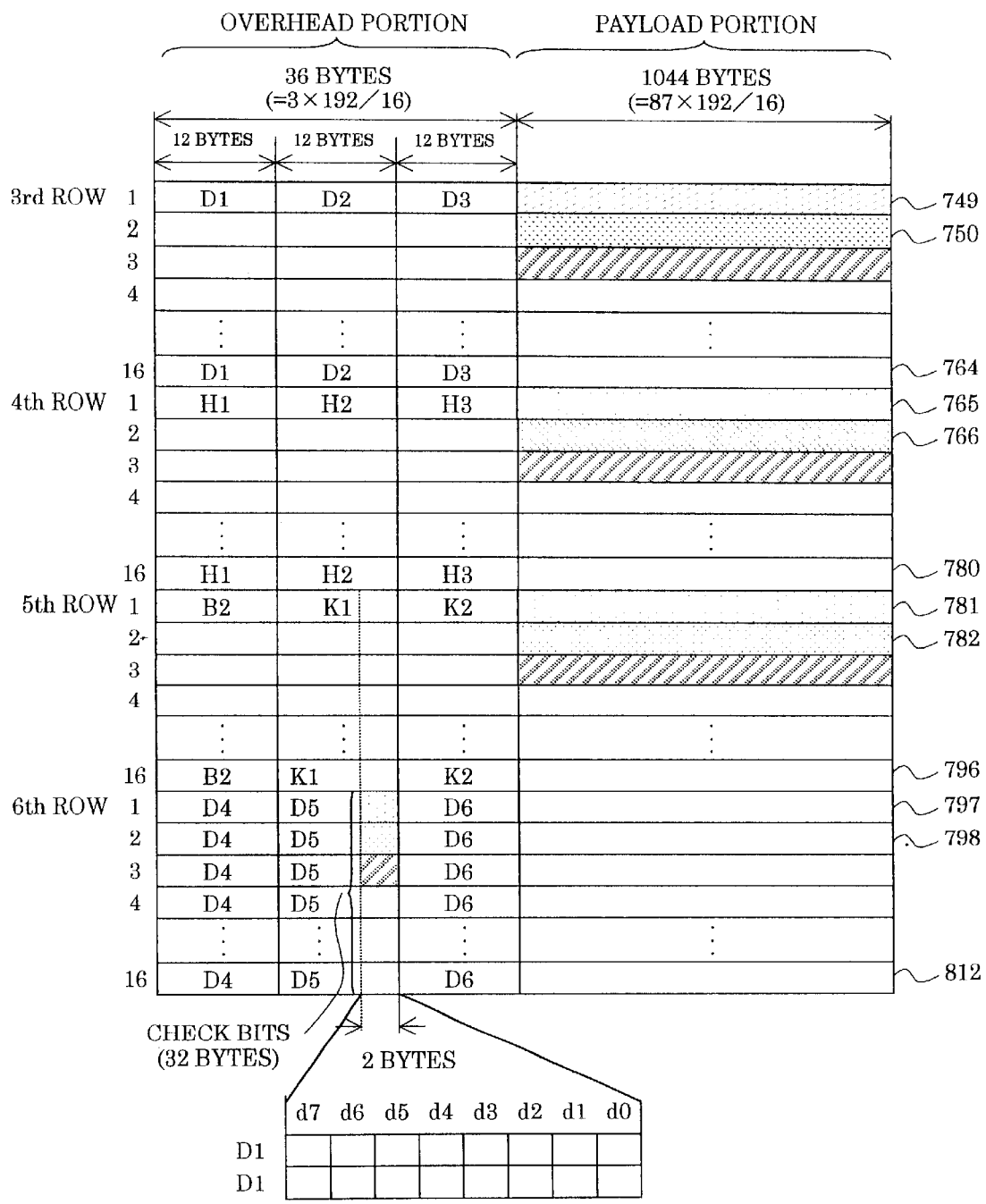
FIG. 4 is a bit map diagram showing an allocation example of a bit allocation (2) of error correcting codes in an STS-192 frame used in an error correcting method and an apparatus therefor according to the present invention.
Figure 5:
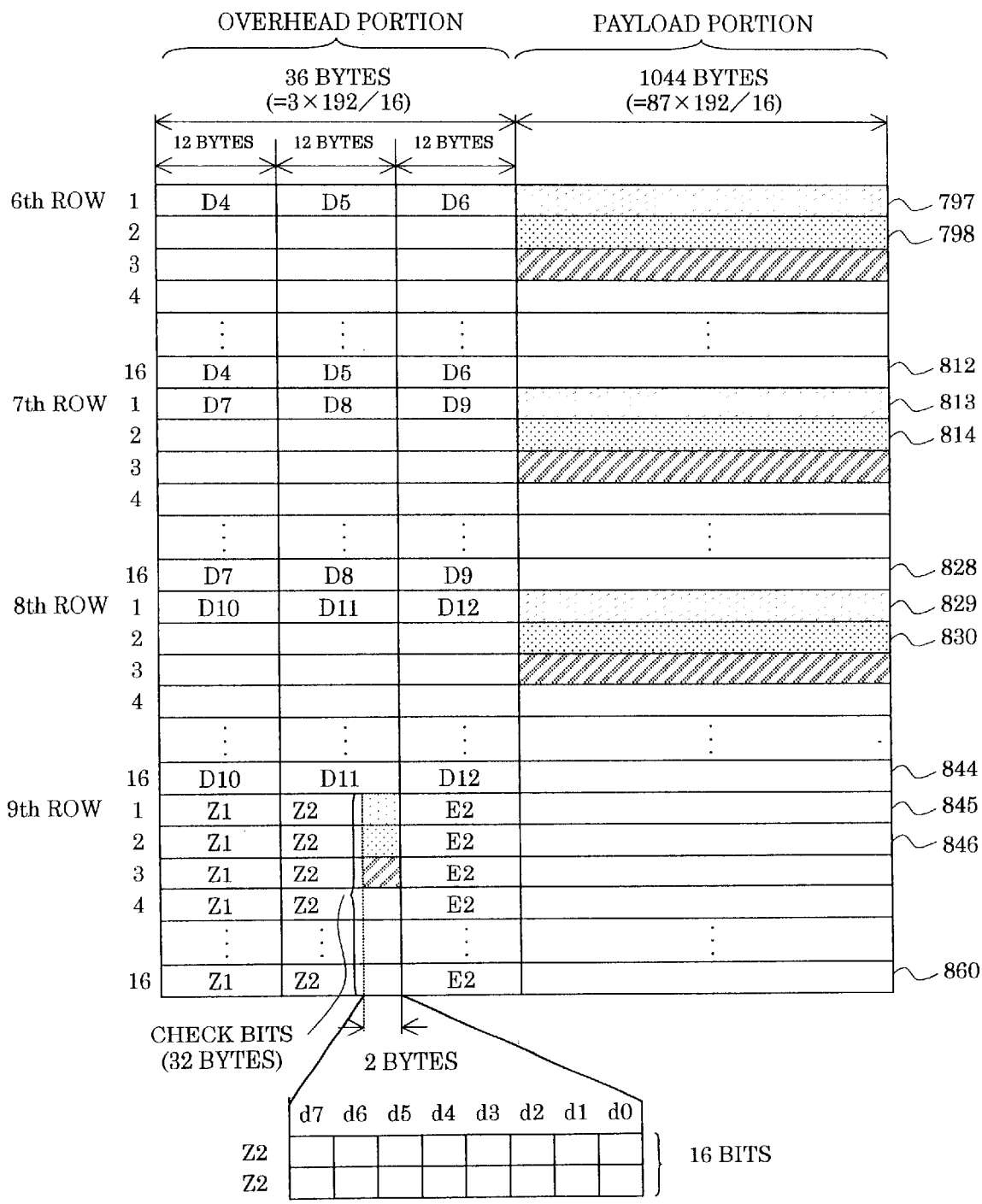
FIG. 5 is a bit map diagram showing an allocation example of a bit allocation (3) of error correcting codes in an STS-192 frame used in an error correcting method and an apparatus therefor according to the present invention.

FIGS. 3–5 respectively show each of three information bit blocks and three check bit blocks shown in FIG. 2.

FIG. 3 shows the block of 9th, 1st, 2nd rows in the payload portion and the block of the K1 byte portion in the LOH portion corresponding to that block. In the 9th, 1st, 2nd rows, the block of the payload portion is further divided into mini blocks 701–716, mini blocks 717–732, and mini blocks 733–748 each of which has 1044 bytes (=87 bytes×192/16).

The combination of mini blocks in each row, such as the mini blocks 701, 717, and 733, the mini blocks 702, 718, and 734, . . . , and the mini blocks 716, 732, and 748 which respectively consist of 25056 bits (1044×8 bits×3 rows) compose M=16 information bit subblocks.

The K1 information block with 32 bytes is correspondingly divided into 16 check bit subblocks consisting of 16 bits (=2 bytes×8 bits).

The aggregation of information bit subblocks and check bit subblocks corresponding to each other compose 16 Hamming code blocks in all.

For instance, the information bit subblocks consisting of the mini blocks 701, 717, and 733 and the K1 byte portion with two bytes which are illustrated with the same pattern as the information bit subblocks compose a single Hamming code block (25072 (=25056 information bits+16 check bits), 25056).

FIG. 4 shows the block of the 3rd–5th rows in the payload portion and the corresponding D5 byte portion of the LOH portion. In the same way as FIG. 3, 16 information bit subblocks respectively consisting of mini blocks 749, 765, and 781, mini blocks 750, 766, and 782, . . . , and mini blocks 764, 780, and 796 as well as the D5 byte portion with two bytes which is illustrated with the same pattern as the subblocks compose a single Hamming code block (25072, 25056).

FIG. 5 shows blocks of the 6th–8th rows in the payload portion and the corresponding Z2 byte portion of the LOH portion. In the same way as FIG. 3, the information bit subblocks composed of mini blocks 797, 814, and 830, mini blocks 798, 815, and 830, and mini blocks 813, 829, and 845 and the Z2 byte portion with two bytes which is illustrated with the same pattern as that of the subblocks compose a single Hamming code block (25072, 25056).

The information bit length of this Hamming code block is 25056<32767, and the generation polynomial G(X)=X$^{16}$+X$^{12}$+X$^{5}$+1, which is recommended by the HDLC (High Data Link Control) procedure of the CCITT data communication standard, can be used. From this generation polynomial G(X) the following equation is obtained when the factor is disassembled according to mod2.

$$G(X)=G_1(X) \cdot G_2(X)=(X+1) \cdot (X^{15}+X^{14}+X^{13}+X^{12}+X^4+X^3+X^2+X+1) \quad \text{(Eq.1)}$$

G2(X) is a primitive polynomial, and G(X) is for an even parity operation.

Namely, the generation polynomial G(X) makes it possible to perform an SEC (Single Error Correction) and detect even errors of the information bits less than $2^{15}-1=32767$.

In this embodiment, it becomes possible to perform the SEC and detect the even errors by using the shortened Hamming codes (25072, 25076).

The shortened Hamming codes (25072, 25076) can be obtained by multiplying H (X) for shortening with the generation polynomial G (X) on a receiver side. The H (X) can be calculated by the next equation on the condition that n=25072 (shortened code length), k=25056 (information but number), j=n$_p$–n (code length made to "0" at the shortened time), n$_p^{16}$–1 (code length before shortening.

$$H(X)=x^{(n-k+j)} \mod G(X) \quad \text{(Eq. 2)}$$

Accordingly, $$H(X) = x^{40479} \mod G(X) \quad \text{(Eq. 3)}$$
$$= X^{13} + X^{10} + X^7 + X^6 + X^2$$

Figure 6:
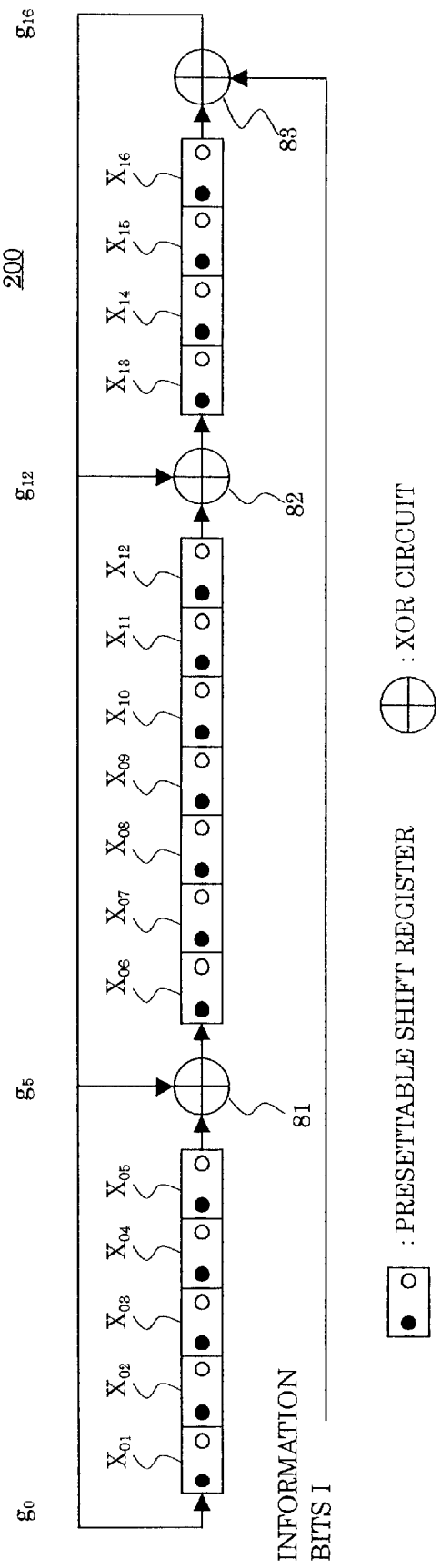
FIG. 6 is a block diagram of a circuit showing an arrangement of a syndrome register provided on the transmitter side in an error correcting method and an apparatus therefor according to the present invention.

FIG. 6 shows an arrangement of a syndrome register 200 for generating the check bits of the shortened Hamming codes (25072, 25056) in an error correcting method and apparatus therefor on a transmitter side according to the present invention.

In the syndrome register 200, presettable shift registers X01–X16 respectively for a single bit are connected in cascade. The exclusive logical sum operated in an XOR circuit 83 of the output signal of the register X16 and an information bits I are inputted to the input terminal of the register X01. The exclusive logical sum operated in an XOR circuit 81 of the XOR circuit 83 and the output signal of the register X05 are inputted to the input terminal of the register X06. The exclusive logical sum operated in an XOR circuit 82 of the XOR circuit 83 and the output signal of the register X12 are inputted to the input terminal of the register X13.

After initializing the presettable shift registers X01–X16, the syndrome register 200 sequentially inputs the information bits I from the input terminal of the XOR circuit 83. When the input of the information bits I for a single block (=25056 bits) is completed, the check bits are outputted from the registers X01–X16. Accordingly, by adding these check bits to the information bits I, the above-mentioned shortened Hamming code can be generated.

Figure 7:
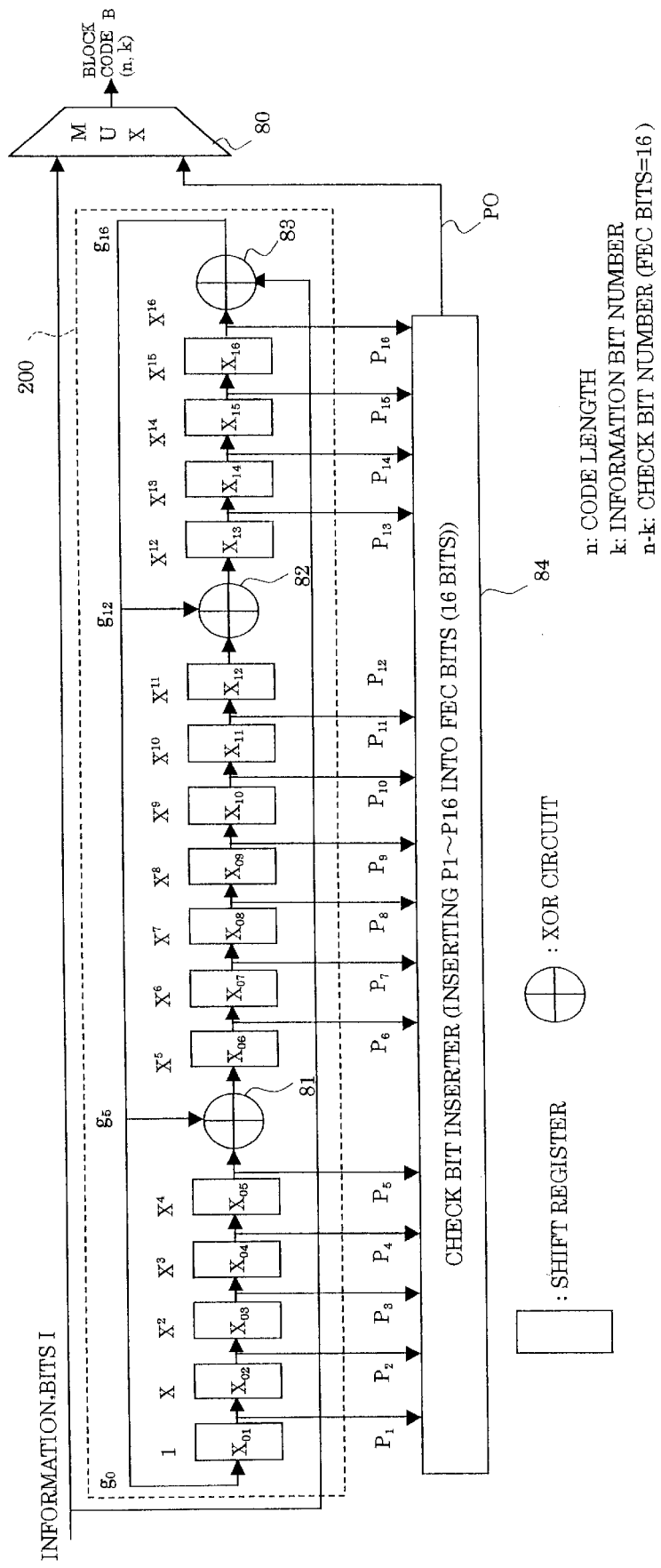
FIG. 7 is a block diagram of a circuit showing an arrangement of an FEC portion provided on the transmitter side in an error correcting method and an apparatus therefor according to the present invention.

FIG. 7 shows an arrangement of a forward error correcting portion (hereinafter abbreviated as an FEC portion) on the transmitter side according to the present invention.

The FEC portion is composed of the syndrome register 200 which is formed of the registers X01–X16 and the XOR circuits 81–83 shown in FIG. 6 and inputs the information bits I, a check bit inserter 84 which inputs output signal P1–P16 respectively of the registers XO 1-Xl 6 in parallel and outputs a check bit signal P0, and a MUX portion 80 which inputs the information bits I, and the check bit signal P0 to generate a shortened Hamming code block B (n=25072, k=25056).

Figure 8:
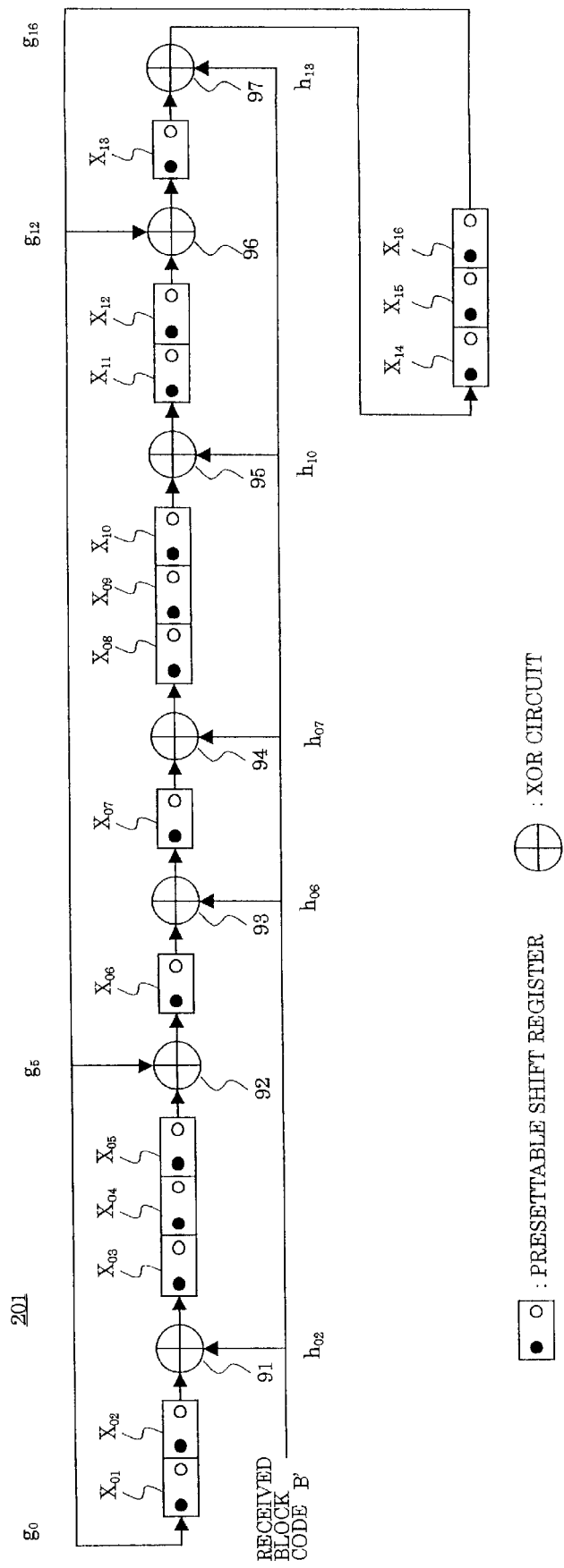
FIG. 8 is a block diagram of a circuit showing an arrangement of a syndrome register provided on the receiver side in an error correcting method and an apparatus therefor according to the present invention.

FIG. 8 shows an embodiment of a syndrome register 201 on the receiver side according to the present invention.

The syndrome register 201 is composed of the 16 single bit presettable shift registers X01–X16 which are connected in cascade. The output signals of XOR circuits 91–97 which respectively input the output signal of the last register of each XOR circuit to one input terminal are inputted to the input terminals of the registers X03, X06, X07, X11, X13, and X14, respectively. A received block code B' is inputted to the other input terminals of the XOR circuits 91, 93, 94, 95, and 97, and the output signal of the register X16 is inputted to the other input terminal of the XOR circuits 92 and 96.

By this arrangement, the syndrome register 201 multiplies H (X) with the above, mentioned generation polynomial G (X) to decode the shortened Hamming code.

After having set the presettable shift registers X01–X16 to the initial value, the syndrome register 201 inputs bit data of the received block code B' in order. When all of the bit data of the received block code B' has been inputted, the syndrome register 201 outputs an error syndrome which indicates an error bit position of the received block code B' from the registers X01–X16.

Figure 9:
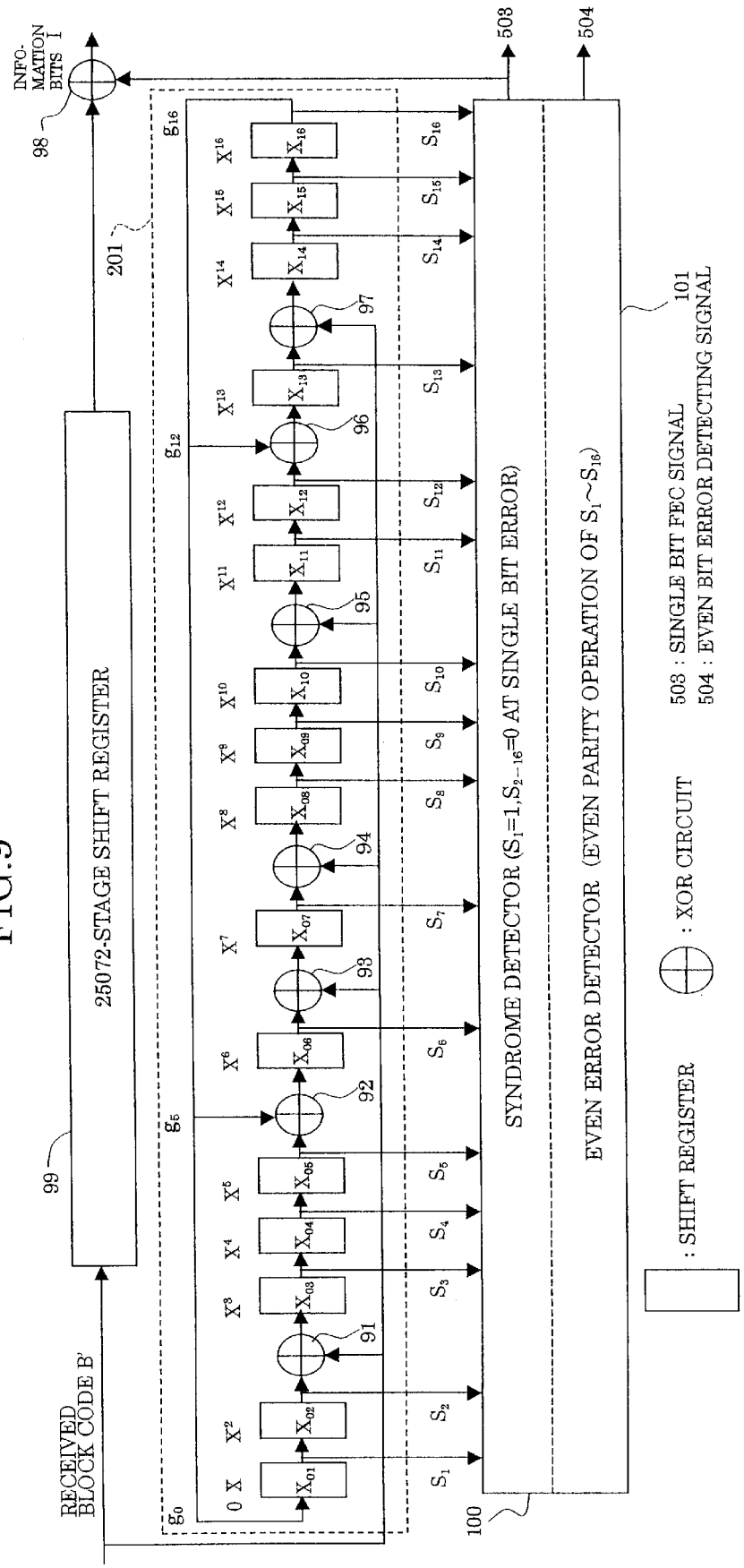
FIG. 9 is a block diagram of a circuit showing an arrangement of an FEC portion provided on the receiver side in an error correcting method and an apparatus therefor according to the present invention.

FIG. 9 shows an arrangement of the FEC portion on the receiver side according to the present invention. This FEC portion is composed of the syndrome register 201 shown in FIG. 8; a syndrome detector 100 which inputs the output signals S1–S16 of the registers X01–X16 which form the syndrome register 201, detects the error syndrome, and outputs a single bit error correcting signal 503; an even error detector 101 which operates an even parity operation and outputs an even bit error detecting signal 504; a 25072-stage shift register 99 which shifts in order the bit data of the received block code B' which is a receiving message; and an XOR circuit 98 which inputs a final stage output signal of the shift register 99 and the even bit error detecting signal 504, and operates these exclusive logical sum.

When the syndrome register 201 is further shifted with the input of the received block code B' being fixed to "0" from an output point of the error syndrome, S1, S2, . . . , S16 assumes 1, 0, . . . , 0 at the time of the shift operation up to the bit when the error occurs in the received block code B'. At this time, the syndrome detector 100 outputs a single bit error correcting signal 503="1".

Only when the single bit error correcting signal 503 is "1", the XOR circuit 98 inverts the output bit of the shift register 99 shifted at the same timing as the syndrome register 201 to be outputted as the information bits I, and outputs the output bits at the other timings as they are.

As a result, the FEC portion corrects bits where the error of the received block code B' is generated to output the same as the information bits I without errors.

When performing the even parity operation based on input signals S1–S16 to detect errors, the even error detector 101 outputs the even bit error detecting signal 504.

Figure 10:
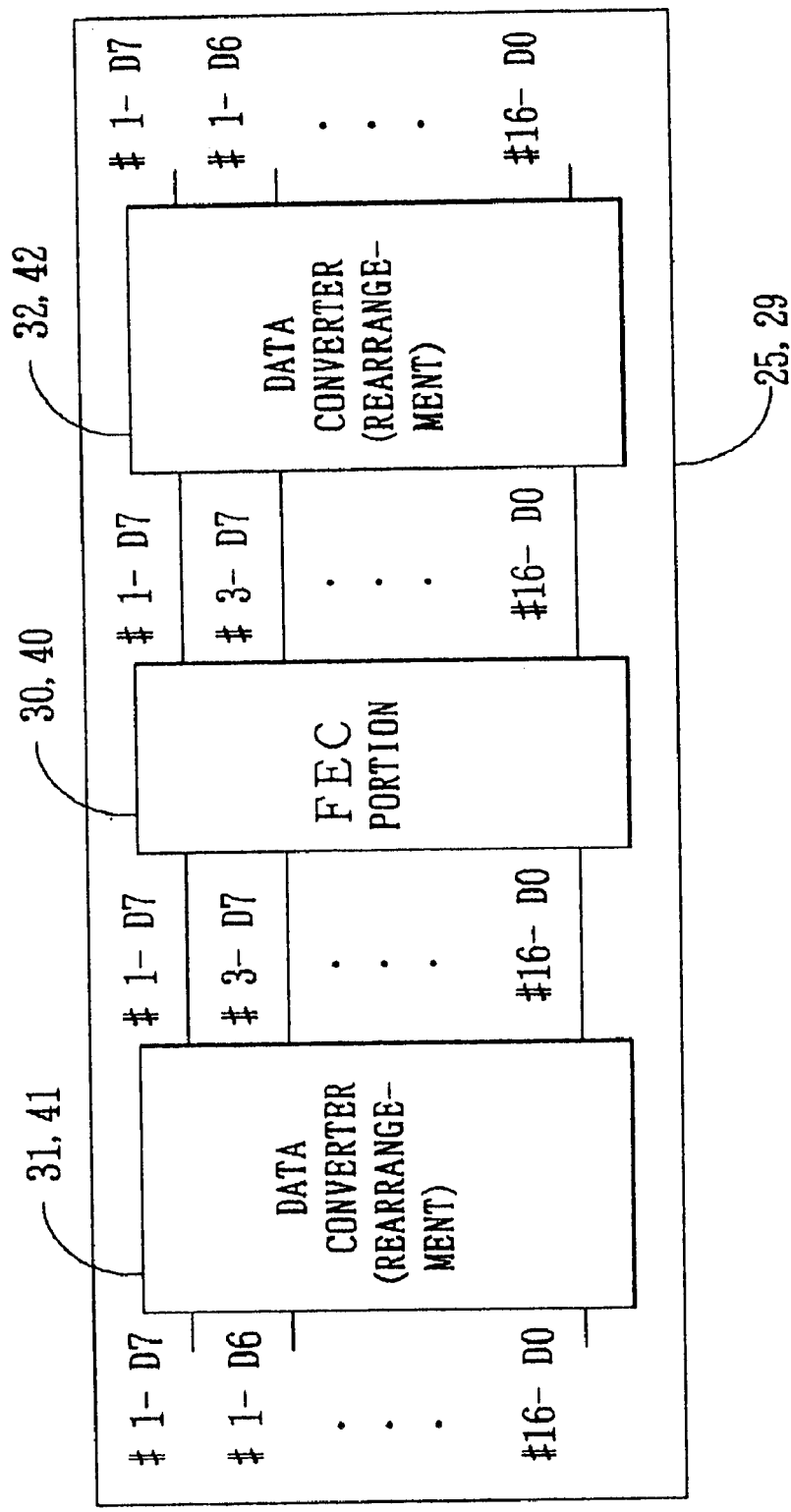
FIG. 10 is a block diagram showing an arrangement in a data converter used in an error correcting method and an apparatus therefor according to the present invention.

FIG. 10 shows an example of an arrangement of a data converter on both of the transmitter/receiver sides according to the present invention. Data converters 31, 41 and data converters 32, 42 are respectively provided on the input and output sides of the FEC portions 30, 40.

The data converters 31, 41 rearrange inputted data #1-D7, #1-D6, . . . , #16-D0 and output them as #1-D7, #3-D6, . . . , #D16-D0 to the FEC portions 30, 40, while the data converters 32, 42 rearrange the inputted data #1-D7, #3-D7, . . . , #16-D0 from the FEC portions 30 and 40, and output them as #1-D7, #1-D6, #D16-D0.

FIG. 11 shows an embodiment of a data grouping done by the data converters 31, 32, 41, and 42 shown in FIG. 10.

A frame used in the SONET is multiplexed/demultiplexed per byte. Accordingly, the process of the error correction and detection by the Hamming codes is also simplified by being performed per byte.

1-#192 shown in FIG. 11 indicate data of a single byte composed of D7–D0 bits, respectively. In the STS-192 frame shown in FIG. 2 by way of example, 87 data groups with a single data group composed of #1-#192 per each row are sequentially transmitted.

In this embodiment, the data groups #1-#192 of 261 (87×3 rows) are divided into groups GP1, GP9, GP2, GP10, GP3, GP11, . . . , GP16 which respectively include data #1, #17, . . . , #177, #9, #25, . . . , #185,–, #16, #32, . . . , #192, and allotted to the information bits (bytes) of the Hamming codes corresponding to the groups GP1, GP9, GP2, GP10, GP3, GP11, . . . , GP16.

Figure 12:
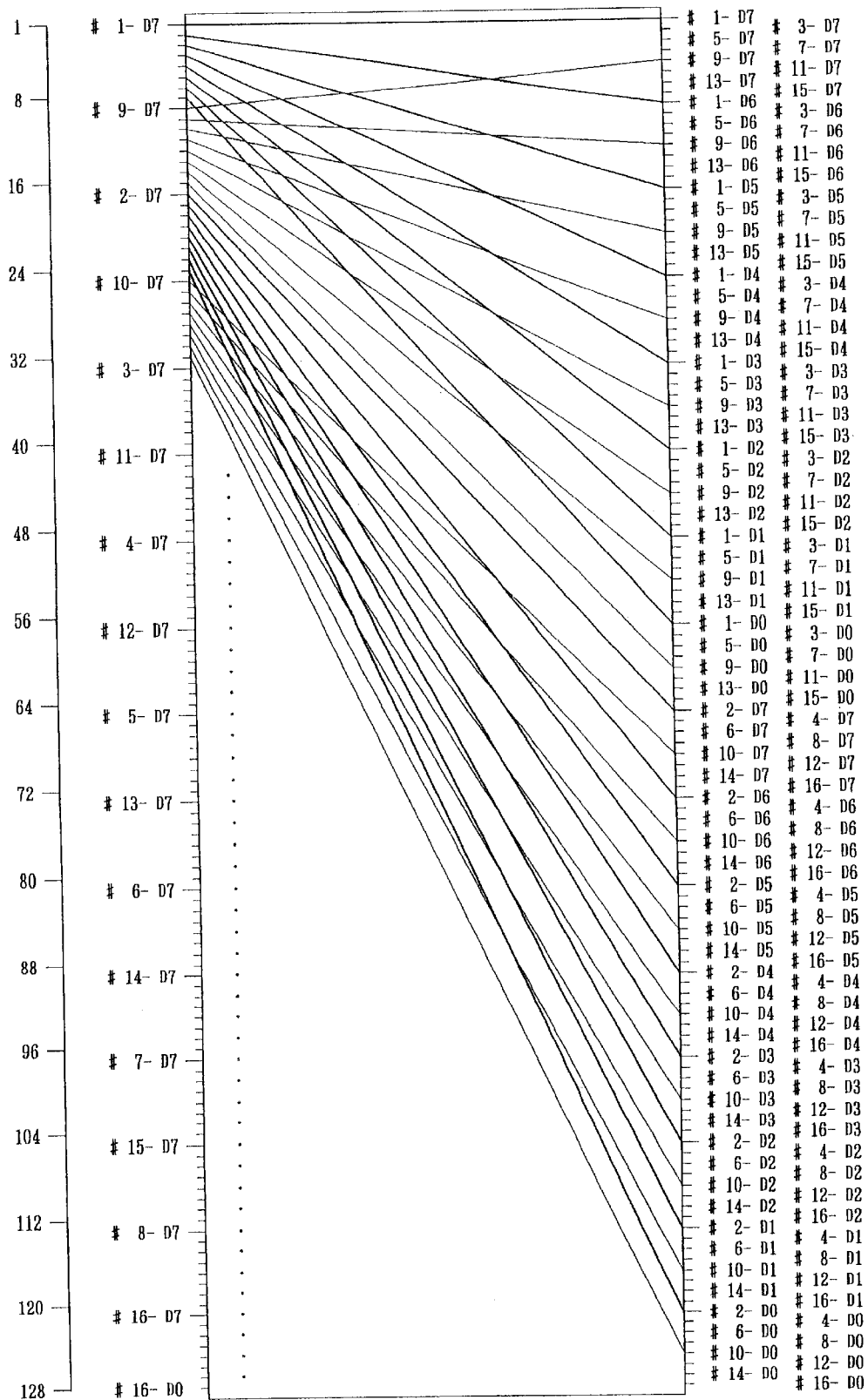
FIG. 12 is a diagram showing a rearrangement example in a data converter used in an error correcting method and an apparatus therefor according to the present invention.

FIG. 12 shows an embodiment of a rearrangement for the data group #1-#192 in the data converters 31, 41. In this example, when each bit (byte) data (#1-D7-D0), (#9-D7-D0), (#2-D7-D0), (#10-D7-D0), (#10-D7-D0), . . . , (#16-D7-D0) before the arrangement is sequentially allotted to the 1st–128th bit data, the order of the bit data after the rearrangement assumes (#1-D7, #3-D7, . . . , #15-D7), (#1-D6, . . . , #15-D6), –, (#1-D0, . . . , #15-D0), (#2-D7, #4-D7, . . . , #16-D7), (#2-D6, . . . , #16-D6),–(#2-D0, . . . , #16-D0).

In the same way, as shown in FIG. 11, the following data #17, #25, #18, . . . , #32, –, #117, #125, #185, . . . , #192 are rearranged.

As a result of this rearrangement, 16 bit data of #1-D7-D0, #2-D7-D0 sequentially inputted is to be dispersed to the Hamming code groups GP1, GP9, GP2, GP10, . . . , GP8, GP16 respectively.

Accordingly, a burst (error bit) of less than sequential 16 bits is to be dispersed to each of the Hamming code groups GP1–GP16 one by one.

Figure 13:
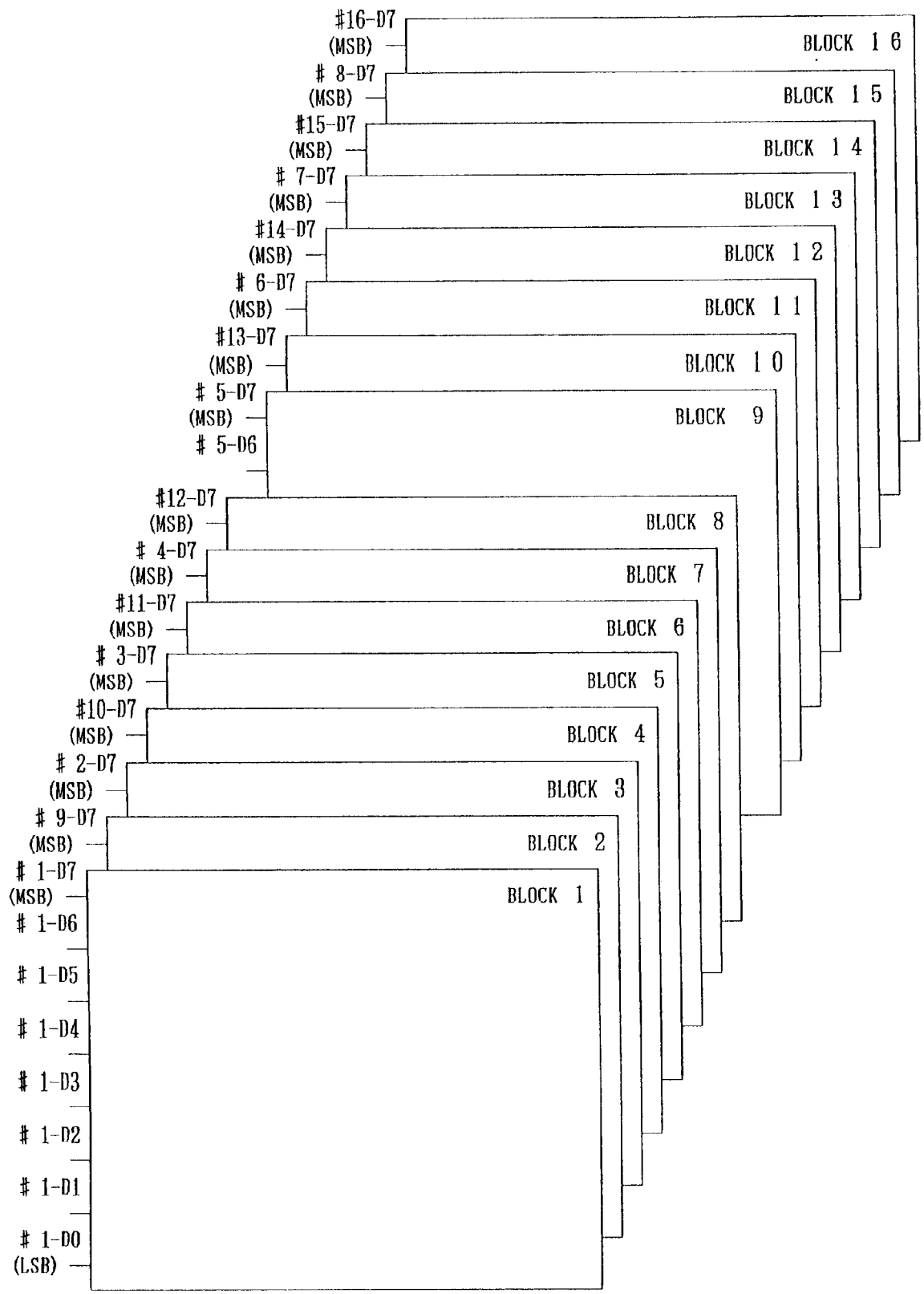
FIG. 13 is a diagram showing a block state before a rearrangement in a data converter used in an error correcting method and an apparatus therefor according to the present invention.

FIGS. 13 and 14 are block diagrams of the embodiment shown in FIG. 12.

Particularly, FIG. 13 shows an input state before the rearrangement, wherein #1-D7-D0, #9-D7-D0, #2-D7-D0, . . . , #16-D7-D0 are respectively inputted to the blocks 1–16 corresponding to the Hamming code groups for the subblocks.

FIG. 14 shows an output state after the rearrangement, wherein #1-D7, #1-D6, . . . , #1-D0, #2-D7, #2-D6, . . . , #2-D0 are dispersed to the blocks 1–16 corresponding to the Hamming code groups for the subblocks.

It is to be noted that the data converters 32 and 42 connected to the latter stage of the FEC portions 30 and 40 perform an opposite rearrangement to the rearrangement shown in FIG. 12.

Namely, on the transmitter side, the data converter 31 disposed at the former stage of the FEC portion 30 performs the rearrangement shown in FIG. 12 to disperse burst error bits to the Hamming code blocks one by one. The FEC portion 30 performs the Hamming-encoding to the inputted information bits to be outputted. The data converter 32 of the latter stage performs the opposite rearrangement and restores the arrangement of the data to its original state to be outputted.

On the receiver side which has received the data, a data converter 41 at the former stage rearranges the data, and the FEC portion 40 detects and corrects a single bit error corresponding to the burst error bits included in each of the Hamming code blocks. The data converter 41 at the latter stage performs the opposite rearrangement and restores the data arrangement to its original state.

It is to be noted that while only the rearrangement of the information bits is described in the above, the rearrangement, the Hamming-encoding, the decoding of the check bits as well as the correction of the burst error bits generated in the check bit portion are also performed in the same way.

As a result, it becomes possible for the FEC portion 40 to correct the burst error bits with the Hamming code.

Figure 15:
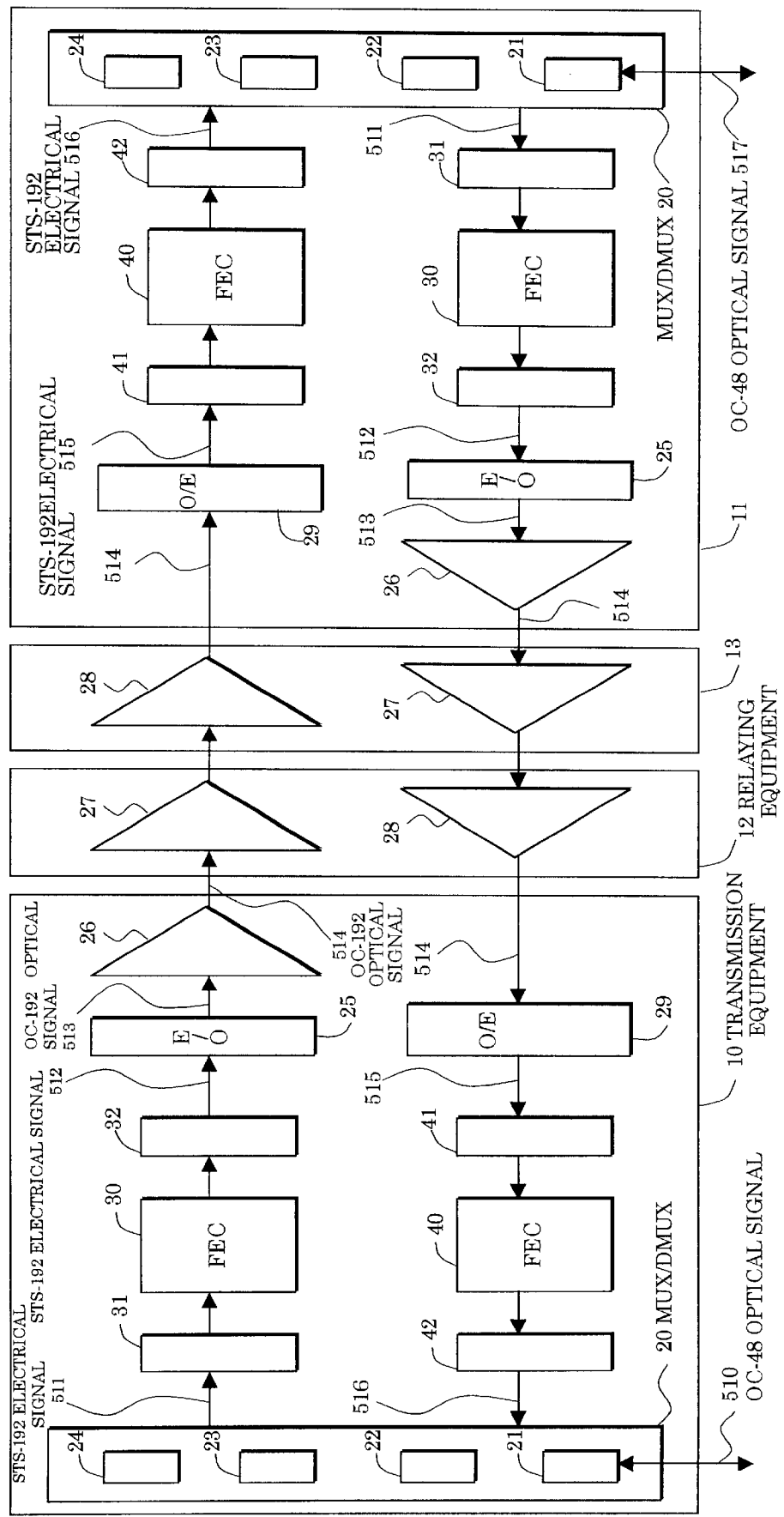
FIG. 15 is a block diagram showing an embodiment for realizing an error correcting method and an apparatus therefor according to the present invention.

FIG. 15 shows an example of an apparatus which performs the error correcting method according to the present invention. In this embodiment, an optical transmission equipment 10 multiplexes four OC-48 optical signals 510 inputted, and outputs the same as an OC-192 optical signal 514. Then the OC-192 optical signal 514 is sent to a transmission equipment 11 with an attenuated amount of optical amplifiers 27 and 28 amplified in relaying equipments 12 and 13. The transmission equipment 11 demultiplexes the received OC-192 optical signal 514 into four OC-48 optical signals 517 as an output.

In the transmission equipment 10, a MUX/DMUX portion 20 receives and multiplexes the OC-48 optical signals 510 in optical electrical converters 21–24 to output the same as an STS-192 electrical signal 511. The data converter 31 having received the STS-192 electrical signal 511 performs the rearrangement of the said data to output the same to the FEC portion 30.

The FEC portion 30 outputs the received data as data to which the Hamming-encoding is performed, which is restored by the data converter 32 to the original arrangement and outputted as an STS-192 electrical signal 512. An E/O converter 25 converts the electrical signal 512 into an OC-192 optical signal 513, which is amplified by an optical amplifier 26 and outputted as the OC-192 optical signal 514.

In the transmission equipment 11, an O/E converter 29 converts the received OC-192 optical signal 514 into an STS-192 electrical signal 515. The data converter 41 performs the rearrangement of the received electrical signal 515, the FEC portion 40 decodes the Hamming codes, and a data converter 42 restores the data arrangement to the original arrangement and outputs the same as an STS-192 electrical signal 516.

After the MUX/DMUX portion 20 demultiplexes the received STS-192 electrical signal 516 into an STS-48 electrical signal, the optical electrical converters 21–24 convert the STS-48 electrical signal into an OC-48 optical signal 517 as an output.

In the same way, the optical transmission equipment 11 outputs the OC-48 optical signal 517 as the OC-192 optical signal 514 to which the Hamming-encoding is performed through the MUX/DMUX portion 20, the data converter 31, the FEC portion 30, the data converter 32, the E/O converter 25, and the optical amplifier 26. The optical transmission equipment 10 which has received the OC-192 optical signal 514 through the optical amplifiers 27 and 28 in the relaying equipments 13 and 12 outputs the OC-48 optical signal 510 whose Hamming code is decoded through the O/E converter 29, the data converter 41, the FEC portion 40, the data converter 42, and the MUX/DMUX portion 20.

Figure 16:
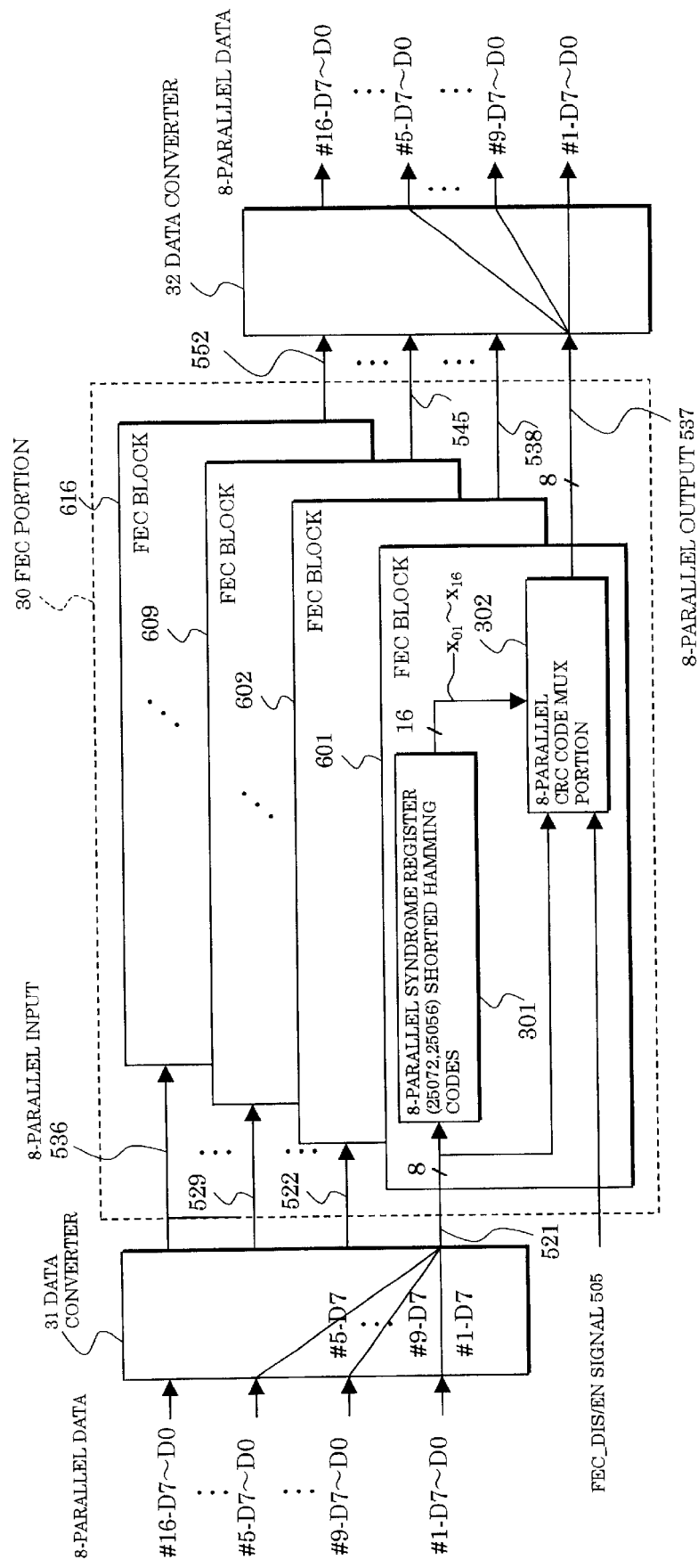
FIG. 16 is a block diagram showing an embodiment of an FEC portion and a data converter provided on the transmitter side in an error correcting method and an apparatus therefor according to the present invention.

FIG. 16 shows an embodiment described in more detail of the data converter 31, the FEC portion 30 and the data converter 32 on the transmitter side especially of the apparatus shown in FIG. 15.

The FEC portion 30 is composed of FEC blocks 601–616, each of which is composed of an 8-bit parallel syndrome register 301 and an 8-parallel CRC code MUX portion 302.

The data converter 31 disperses the bits of 8-bit parallel data (hereinafter abbreviated as 8-parallel data) D7-D0 of each data #1-#16 in the blocks 1–16 shown in FIGS. 13 and 14 into the blocks 1–16, which are rearranged and outputted as 8-parallel input signals 521–536.

The 8-parallel input signal 521 inputted to the FEC block 601 firstly comprises #1-D7, #3-D7, . . . , #15-D7. Hereinafter according to the data grouping shown in FIG. 11, the 8-parallel input signal 521 is inputted into the FEC block 601 in the order of #17-D7, #39-D7, . . . , #31-D7, –#177-D7,#179-D7, . . . , #184-D7.

When an FEC_DIS/EN signal 505 indicates "enable (EN)" in the FEC block 601, the MUX portion 302 inputs the 8-parallel input signal 521 to sequentially output the same as an 8-parallel output signal 537. A syndrome register 301 sequentially shifts the 8-parallel input signal 521 per 8 bits to output the same as 16-parallel output signals x01-x16 to the MUX portion 302. The MUX portion 302 outputs the check bits of the 16-parallel output signals x01-x16 per 8 bits as the 8-parallel output signal 537.

When the FEC_DIS/EN signal 505 indicates "disable (DIS)", the MUX portion 302 sequentially outputs the 8-parallel input signal 521 as the 8-parallel output signal 537 and outputs the predetermined eigen value at the output timing of the check bits.

Namely, when the FEC_DIS/EN signal 505 indicates "enable", the MUX portion 302 encodes the inputted 8-parallel input signals 521–536 into the Hamming codes. When the FEC_DIS/EN signal 505 indicates "disable", the MUX portion 302 does not perform the Hamming-encoding and outputs the signals 521–536 as the 8-parallel output signals 537–552.

The data converter 32 having inputted the 8-parallel output signals 537–552 performs the opposite rearrangement to that shown in FIGS. 13 and 14, and restores the bit data dispersed to the FEC blocks 610–616 to the original state.

Figure 17:
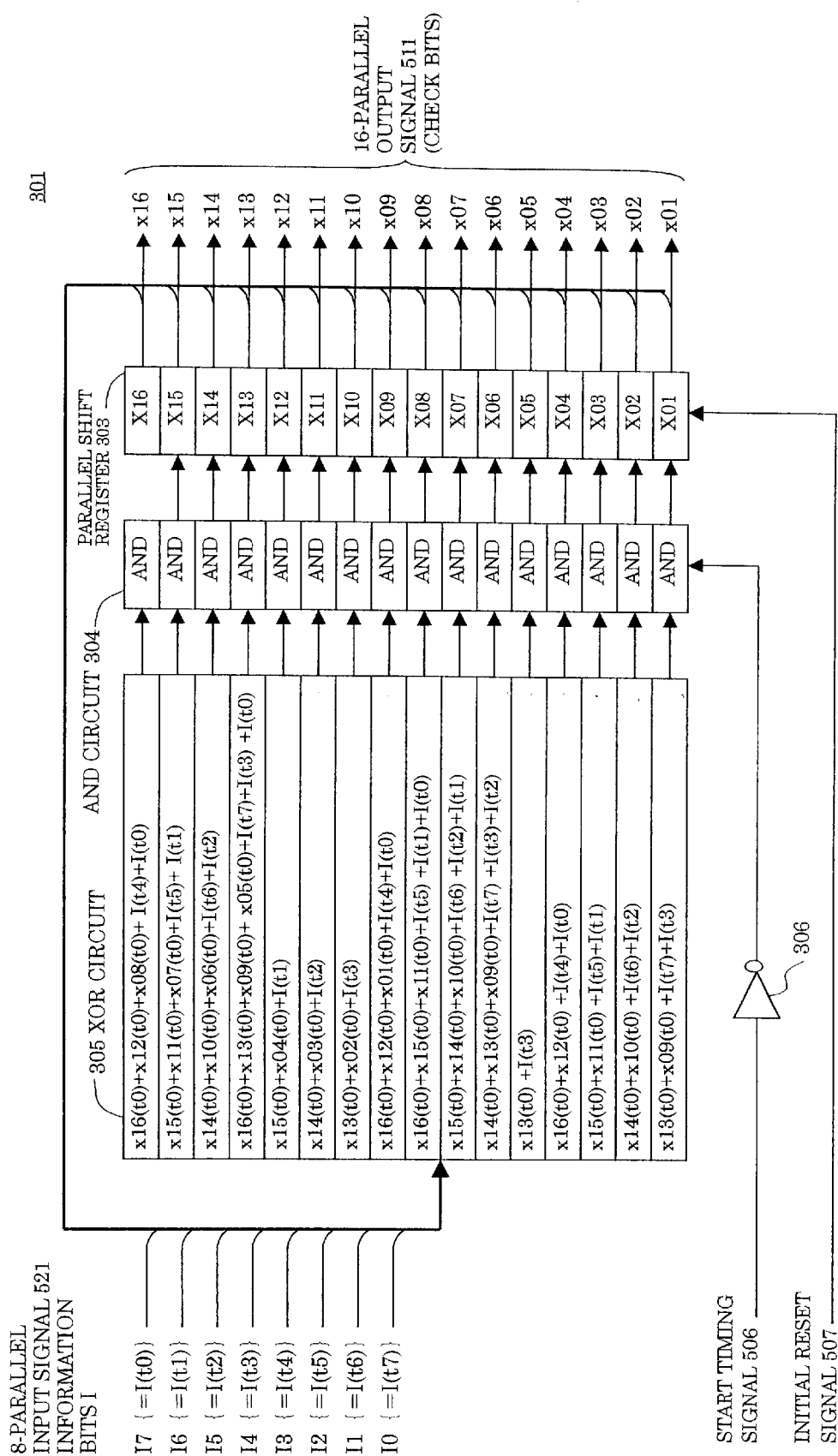
FIG. 17 is a block diagram showing an embodiment of syndrome registers in the form of 8-parallel provided on the transmitter side in an error correcting method and an apparatus therefor according to the present invention.

FIG. 17 shows an embodiment of the 8-parallel syndrome register 301 shown in FIG. 16.

This syndrome register 301 is composed of a parallel shift register 303 which inputs an initial reset signal 507 and outputs syndrome states x01-x16 (=16-parallel output signal), an XOR circuit 305 which inputs the syndrome states x01-x16 and information bits I (I0, . . . , I7) (=8-parallel input signal) forming a information vector, a NOT circuit 306 which inputs a start timing signal 506, and an AND circuit 304 which inputs the output signals of the NOT circuit 306 and the XOR circuit 305 and provides the output signals to the input terminal of the parallel shift register 303.

The syndrome register 301 is composed of 16 single bit parallel input-parallel output registers (flip flops) X01-X16 which can be preset, and the AND circuit 304 is composed of 16 AND circuits whose input terminals on one side are commonly connected to the output terminal of the NOT circuit 306, and whose input terminals on the other side are connected to the output terminals of the XOR circuit 305.

The XOR circuit 305 is composed of 16 XOR circuits which perform different XOR logical operations as shown in FIG. 17. It is to be noted that an operator+indicates an XOR (the exclusive logical sum) operation.

In operation, the XOR circuit 305 inputs the information bits I (I0, . . . , I7) at the time t and the syndrome states x01-x16 which are provided by the output signals of the registers X01-X16. Each of XOR circuits composing the XOR circuit 305 performs the logical operation shown by the following equations (3)–(18) and outputs the operation result to each of AND circuits composing the AND circuit 304. When the start timing signal 506 is "0", that is the common input of the AND circuit is "1", these AND circuits provide the operation results to the registers X01-X16 as they are.

$$x01(t8)=x13(t0)+x09(t0)+I(t7)+I(t3) \quad \text{(Eq. 3)}$$

$$x02(t8)=x14(t0)+x10(t0)+I(t6)+I(t2) \quad \text{(Eq. 4)}$$

$$x03(t8)=x15(t0)+x11(t0)+I(t5)+I(t1) \quad \text{(Eq. 5)}$$

$$x04(t8)=x16(t0)+x12(t0)+I(t4)+I(t0) \quad \text{(Eq. 6)}$$

$$x05(t8)=x13(t0)+I(t3) \quad \text{(Eq. 7)}$$

$$x06(t8)=x14(t0)+x13(t0)+x09(t0)+I(t7)+I(t3)+I(t2) \quad \text{(Eq. 8)}$$

$$x07(t8)=x15(t0)+x14(t0)+x10(t0)+I(t6)+I(t2)+I(t1) \quad \text{(Eq. 9)}$$

$$x08(t8)=x16(t0)+x15(t0)+x11(t0)+I(t5)+I(t1)+I(t0) \quad \text{(Eq. 10)}$$

$$x09(t8)=x16(t0)+x12(t0)+x01(t0)+I(t4)+I(t0) \quad \text{(Eq. 11)}$$

$$x10(t8)=x13(t0)+x02(t0)+I(t3) \quad \text{(Eq. 12)}$$

$$x11(t8)=x14(t0)+x03(t0)+I(t2) \quad \text{(Eq. 13)}$$

$$x12(t8)=x15(t0)+x04(t0)+I(t1) \quad \text{(Eq. 14)}$$

$$x13(t8)=x16(t0)+x13(t0)+x09(t0)+x05(t0)+I(t7)+I(t3)+I(t0) \quad \text{(Eq. 15)}$$

$$x14(t8)=x14(t0)+x10(t0)+x06(t0)+I(t6)+I(t2) \quad \text{(Eq. 16)}$$

$$x15(t8)=x15(t0)+x11(t0)+x07(t0)+I(t5)+I(t1) \quad \text{(Eq. 17)}$$

$$x16(t8)=x16(t0)+x12(t0)+x08(t0)+I(t4)+I(t0) \quad \text{(Eq. 18)}$$

The operator + means an exclusive logical sum.

x01(t0)-x16(t0) and x01(t8)-x16(t8) respectively indicate the output states of the registers X01–X16 at the times t0 and t8, while I (t0–t8) indicates the information bits I at the times t0–t8.

The logical operation Eqs. (1)–(16) are prepared in order that the output states (x01'–x16') at the time t8 are operated in parallel from the information bits I (I0, . . . , I7) which are put in parallel at the times t0–t7 and the output states (x01–x16) of the registers X01–X16.

Accordingly, the output states x01(t0)-x16(t0) of the shift registers X01–X16 turn to be the output states x01(t8)-x16(t8) at the time t8 by a shift command at the time t8.

When all the information bits I for a single Hamming code block have been completely shifted, the shift registers X01–X16 output the check bits.

Namely, the syndrome register 301 inputs the information bits I (I0–I7), not in the form of serial data such as provided by the syndrome register 200 shown in FIG. 6 but in the form of parallel data, sequentially operates the output states x01–x16 with the logical operation of the XOR circuit 305, and performs a Hamming code operation by finally outputting the check bits as the 16-parallel output signal.

As a result, it becomes possible for the syndrome register 301 to process 8-bit information bits I0–I7 in parallel (per byte), whereby an LSI operation margin for the syndrome register 301 is secured for a frame which has a high transmission speed. The syndrome register 301 is suitable for the SONET which is multiplexed/demultiplxed per byte.

Figure 18:
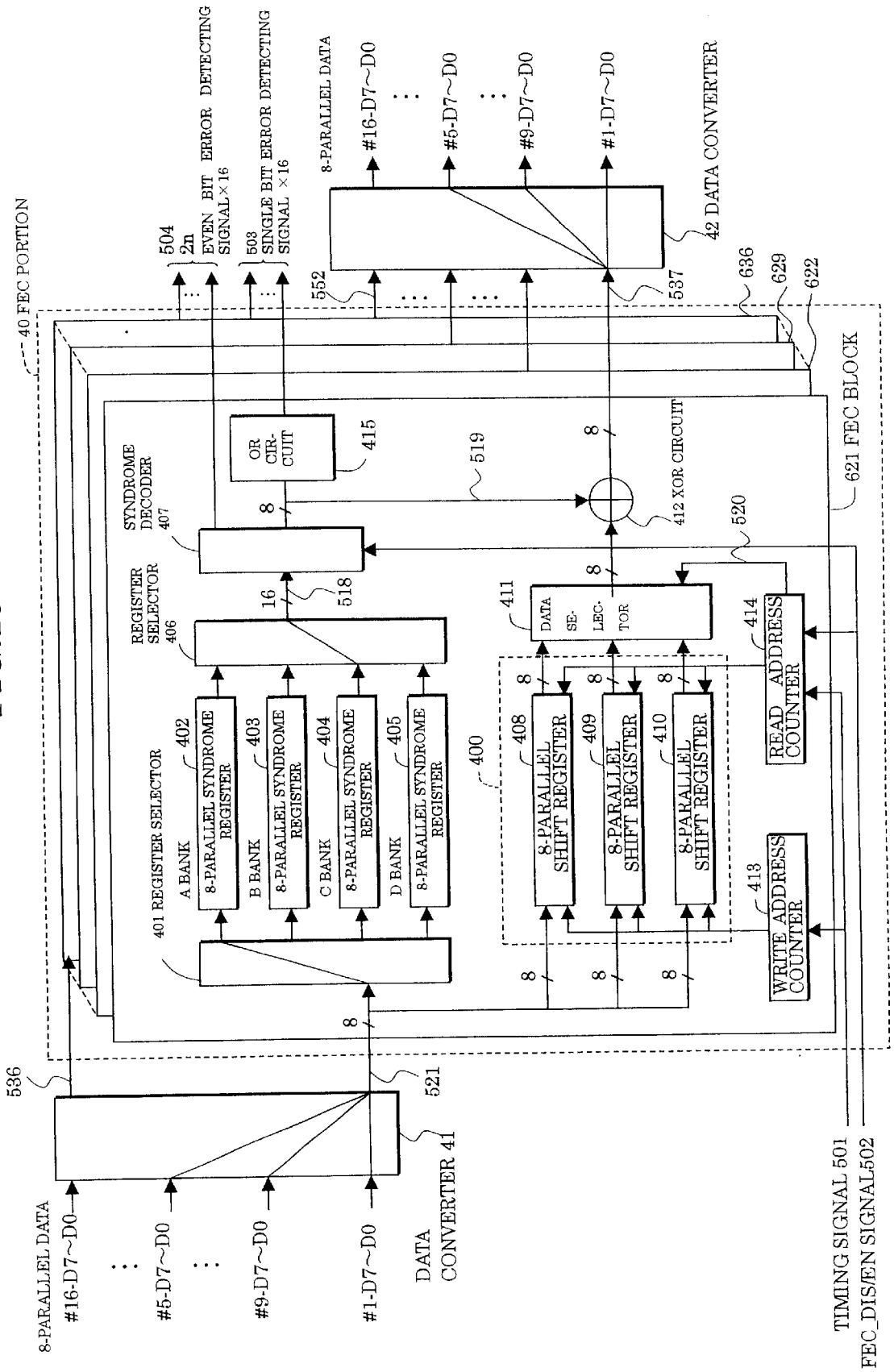
FIG. 18 is a block diagram showing an embodiment including an FEC portion and a data converter provided on the receiver side in an error correcting method and an apparatus therefor according to the present invention.

FIG. 18 shows an example of an apparatus on the receiver side performing the error correcting method according to the present invention, and particularly shows an embodiment of the FEC portion 40 and the data converters 41 and 42.

In this example, the FEC portion 40 is composed of the FEC blocks 621–636 which have the same function with each other, and the data converters 41 and 42 have the same function as the data converters 31 and 32 on the transmitter side shown in FIG. 16.

Namely, the data converter 41 rearranges the 8-parallel data #1-D7-D0, #9-D7-D0, . . . , #16-D7-D0 into 8-parallel input signals 521–536 which are inputted to the FEC blocks 621–636. The data converter 42 performs the opposite rearrangement to that of the data converter 41 with respect to the 8-parallel output signals 537–552 from the FEC blocks 621–636 to restore the data arrangement to the original state.

The FEC block 621 includes a register selector 401 which inputs the 8-parallel input signal 521, 8-parallel shift registers 408–410 set in a pseudo form on an RAM 400, and a data selector 411 which selects the output data of the shift registers 408–410 to output the selected data.

In addition, the FEC block 621 includes a write address counter 413 which receives a timing signal 501 from the outside and provides a write address signal to the shift registers 408–410, and a read address counter 414 which inputs the timing signal 501 and an FEC_DIS/EN signal 502 and provides a read address signal to the shift registers 408–410 and a decoding signal 520 to the data selector 411.

Moreover, the FEC block 621 includes 8-parallel syndrome registers 402–405 to which the 8-parallel input signal 521 is inputted after the bank switchover performed at the register selector 401, and a register selector 406 which selects and outputs the output signal, i.e. 16-bit syndrome signal 518 after the bank switchover performed at the syndrome registers 402–405.

Furthermore, the FEC block 621 includes a syndrome decoder 407 which inputs the selected syndrome signal 518 to be decoded and the FEC_DIS/EN signal 502 and outputs the even bit error detecting signal 504 and an 8-bit error syndrome signal 519, an OR circuit 415 which receives the 8-bit error syndrome signal 519 and outputs a single bit error correcting signal 503, and an XOR circuit 412 which inputs the 8-bit error syndrome signal 519 and the output signal of the data selector 411, which are outputted as the 8-parallel output signal 537.

Figure 19:
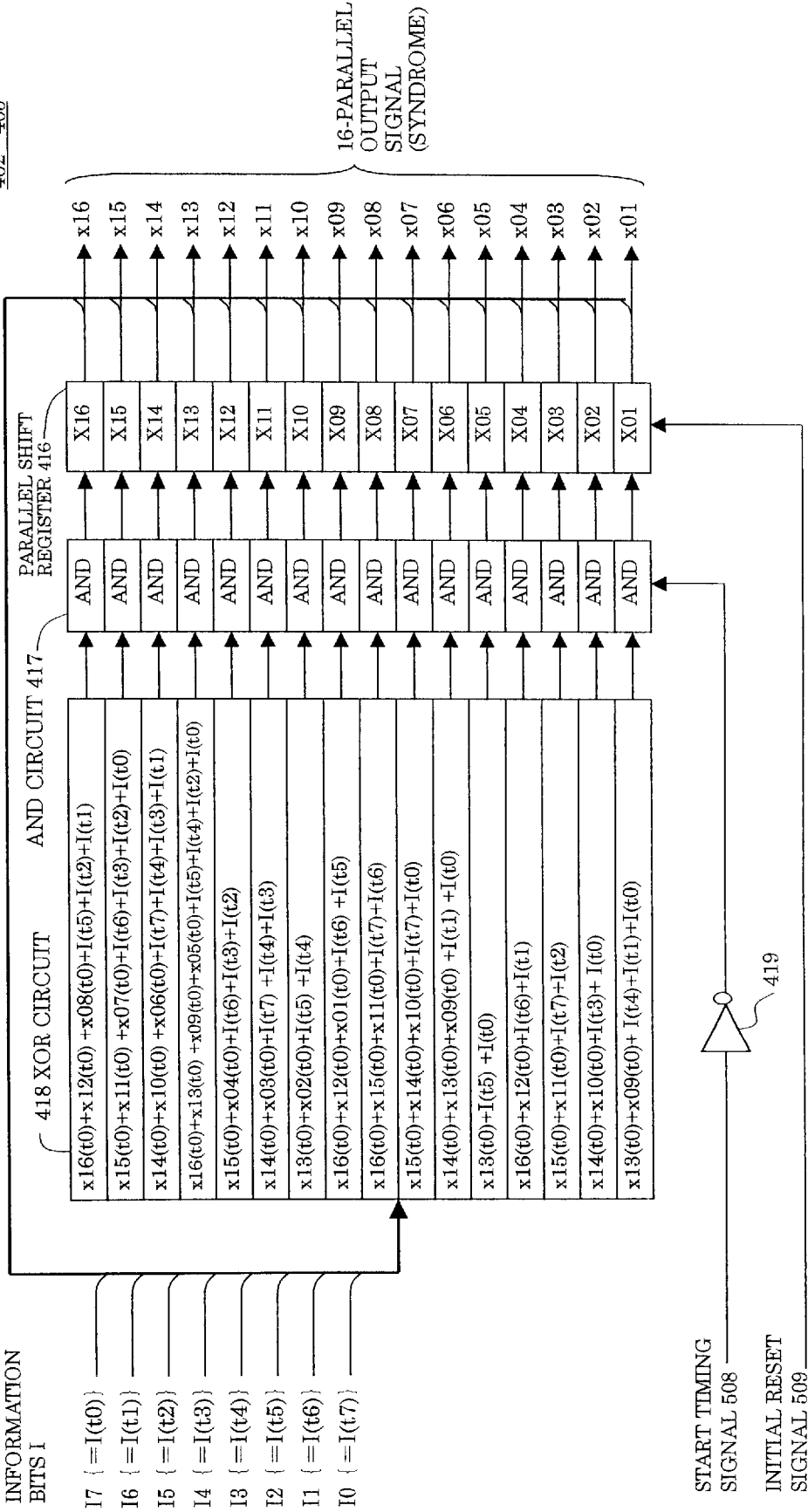
FIG. 19 is a block diagram showing an embodiment of syndrome registers in the form of 8-parallel provided on the receiver side in an error correcting method and an apparatus therefor according to the present invention.

FIG. 19 shows an embodiment of the 8-parallel syndrome registers 402–405 shown in FIG. 18. In this example, the syndrome registers 402–405 are respectively composed of a parallel shift register 416, an AND circuit 417, an XOR circuit 418, and an NOT circuit 419. The only point different from the syndrome register 301 is that the XOR circuit 418 has a different logical composition from that of the XOR circuit 305 of the syndrome register 301 on the transmitter side shown in FIG. 17.

Each of XOR logical equations in the XOR circuit 418 is described by the following equations.

$$x01(t8)=x13(t0)+x09(t0)+I(t4)+I(t1)+I(t0) \quad \text{(Eq. 19)}$$

$$x02(t8)=x14(t0)+x10(t0)+I(t3)+I(t0) \quad \text{(Eq. 20)}$$

$$x03(t8)=x15(t0)+x11(t0)+I(t7)+I(t2) \quad \text{(Eq. 21)}$$

$$x04(t8)=x16(t0)+x12(t0)+I(t6)+I(t1) \quad \text{(Eq. 22)}$$

$$x05(t8)=x13(t0)+I(t5)+I(t0) \quad \text{(Eq. 23)}$$

$$x06(t8)=x14(t0)+x13(t0)+x09(t0)+I(t1)+I(t0) \quad \text{(Eq. 24)}$$

$$x07(t8)=x15(t0)+x14(t0)+x10(t0)+I(t7)+I(t0) \quad \text{(Eq. 25)}$$

$$x08(t8)=x16(t0)+x15(t0)+x11(t0)+I(t7)+I(t6) \quad \text{(Eq. 26)}$$

$$x09(t8)=x16(t0)+x12(t0)+x01(t0)+I(t6)+I(t5) \quad \text{(Eq. 27)}$$

$$x10(t8)=x13(t0)+x02(t0)+I(t5)+I(t4) \quad \text{(Eq. 28)}$$

$$x11(t8)=x14(t0)+x03(t0)+I(t7)+I(t4)+I(t3) \quad \text{(Eq. 29)}$$

$$x12(t8)=x15(t0)+x04(t0)+I(t6)+I(t3)+I(t2) \quad \text{(Eq. 30)}$$

$$x13(t8)=x16(t0)+x13(t0)+x09(t0)+x05(t0)+I(t5)+I(t4)+I(t2)+I(t0) \quad \text{(Eq. 31)}$$

$$x14(t8)=x14(t0)+x10(t0)+x06(t0)+I(t7)+I(t4)+I(t3)+I(t1) \quad \text{(Eq. 32)}$$

$$x15(t8)=x15(t0)+x11(t0)+x07(t0)+I(t6)+I(t6)+I(t2)+I(t0) \quad \text{(Eq. 33)}$$

$$x16(t8)=x16(t0)+x12(t0)+x08(t0)+I(t5)+I(t2)+I(t1) \quad \text{(Eq. 34)}$$

The operator + means an exclusive logical sum.

x01(t0)-x16(t0) and x01(t8)-x16(t8) respectively indicate the output states of the registers X01–X16 at the times t0 and t8, and I(t0–t8) indicate the information bits I at the times t0–t8.

Figure 20:
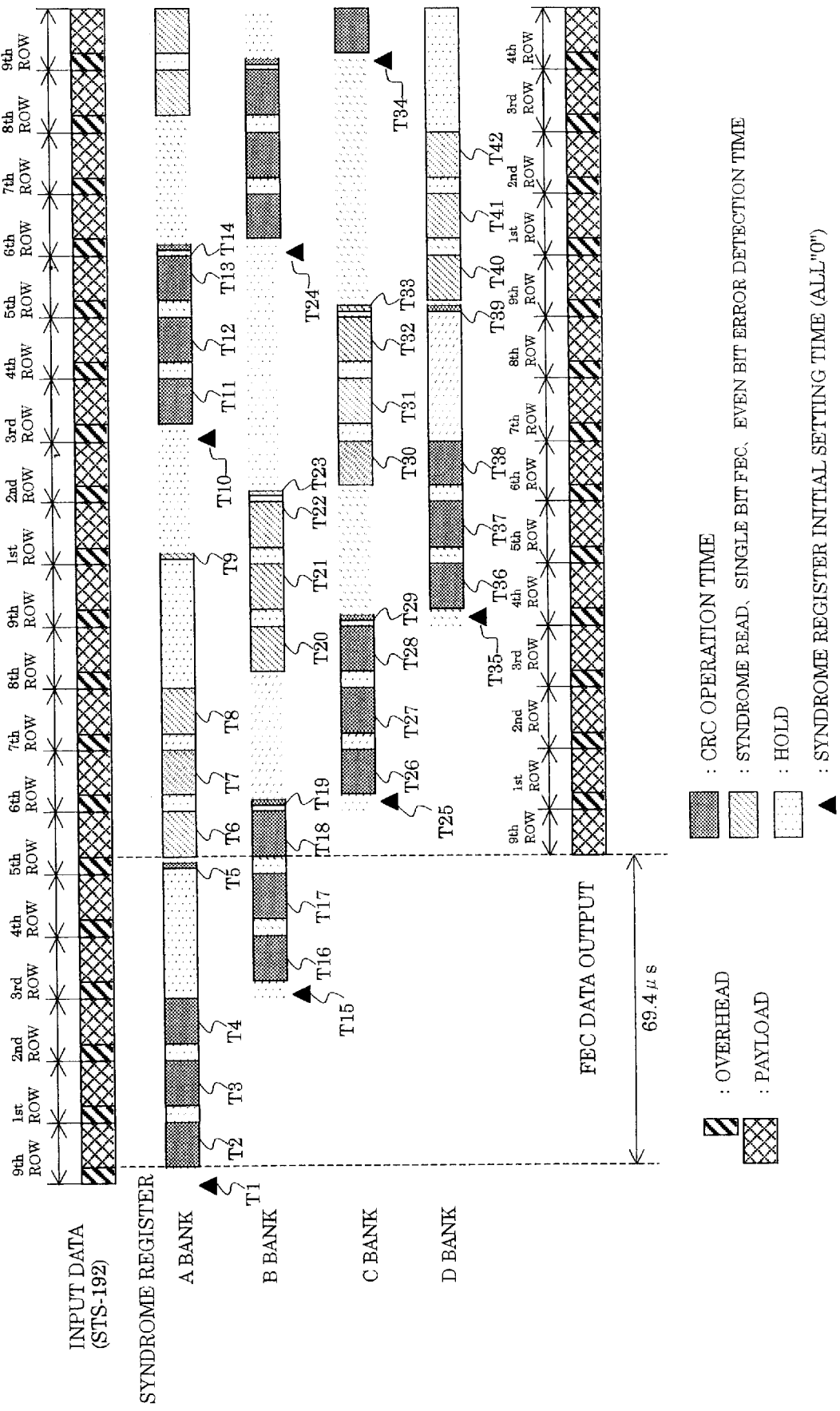
FIG. 20 is a timing chart showing an operation example of an FEC portion provided on the receiver side in an error correcting method and an apparatus therefor according to the present invention.

FIG. 20 shows operation timings of the FEC blocks 621–636 shown in FIG. 18. The operation of the FEC block in FIG. 18 will now be described referring to FIG. 20.

The 8-parallel input signals 521–536 in FIG. 18 are provided in the order of the payload portion of the 9th row of the STS-192 frame, an OH portion and the payload portion of the 1st row, the OH portion and the payload portion of the 2nd row, and the like, and are rearranged at the data converter 41, as shown in the form of input data in FIG. 20.

The register selector 401 firstly selects the 8-parallel syndrome register 402. The register 402 is cleared at the time T1 and is set to all "0". The register 402 does not input the data of the OH portion with a hold state at the timing of the OH portion of the 9th row, and inputs the payload portion of the 9th row at the next time T2.

In the same way, the register 402 inputs the payload portion in the 1st row at the time T3 and of the 2nd row at the time T4, assumes the hold state at the timing of the OH portion and the payload portion of the 3rd–4th rows, and inputs only the check bits in the K1 byte portion in the 5th row at the time T5.

As a result, the information bits of the payload portion of the 9th, 1st, and 2nd rows and the check bits in the K1 byte portion of the 5th row are shifted and inputted into the register 402, so that the syndrome is provided to the output terminal.

At the times T6, . . . , T9, the syndrome register 402 is shifted with the input terminal being made "0". The output state of the syndrome register 402 is selected by the register selector 406 at the times T6, . . . , T9, and inputted to the syndrome decoder per 16 bits.

Likewise, after having been set initially to "0" at the times T15, T25, and T35, the syndrome registers 403, 404, and 405 input the DS byte portion where the check bits of the payload portion of the 3rd, 4th, and 5th rows as well as the OH portion of the 6th row are allotted at the times T16, T17, T18, and T19, the Z2 byte portion where the check bits of the payload portion of the 6th, 7th, and 8th rows as well as the OH portion of the 9th row are allotted at the times T26, T27, T28, and T29, and the Z2 byte portion where the check bits of the payload portion of the 9th, 1st, and 2nd rows as well as the OH portion of the 5th row are allotted at the times T36, T37, T38, and T39.

Accordingly, to the syndrome registers 403–405 the corresponding information bits and check bits of the payload portion are inputted to form a syndrome.

The syndrome registers 403, 404, and 405 are shifted at the times T20, . . . , T23, at the times T30, . . . , T33, and at the times T40, . . . , T43, respectively with the input terminals set to all "0". The syndrome of the syndrome registers 403, 404, and 405 is selected by the register selector 406 to be inputted to the syndrome decoder 407 per 16 bits.

The syndrome decoder 407 detects the timing when the error bits are generated from the inputted syndrome, and provides the OR circuit 415 and the XOR circuit 412 with the error syndrome signal 519 per 8 bits.

The OR circuit 415 detects a single bit error correcting signal where a single bit is generated at most every Hamming code block, and outputs the error correcting signal as a single bit error correcting signal 503.

On the other hand, the 8-parallel shift registers 408–410 on the RAM sequentially stores all of the data of the payload portions and the OH portions of the inputted 9th, 1st, . . . , 9th, . . . , etc rows in the place designated by the write address counter 413 per byte.

The input data stored in the shift registers 408–410 are read out in the order of storage per byte with the timing when the payload portion of the 5th row is inputted by the read address counter 414 and the data selector 411, and inputted to the XOR circuit 412.

Namely, the STS-192 frame inputted to the FEC block is inputted to the XOR circuit 412 in 69.4 μseconds later, as shown in the FEC data output in FIG. 20.

The XOR circuit 412 inverts the error bits of the STS-192 frame per byte inputted based on the 8-bit error syndrome signal 519 from the syndrome decoder 407 to output the same as error corrected FEC output data 537.

Namely, the STS-192 frame inputted in a dispersed form into the FEC blocks 621–636 are outputted as the output signals 537–552 with the error bits corrected, and the data converter 41 which has inputted thereto the output signals 537–552 outputs the signals as 8-parallel data whose arrangement is restored to the original state.

The above-mentioned operation is performed when the FEC_DIS/EN signal 502 shows "enable (EN)" indicating that the FEC function should be performed. When the FEC_DIS/EN signal 502 shows "disable (DIS)", the read address counter 414 provides an address to pass the input signals 521–526 through the 8-parallel shift registers 408–470, and the syndrome decoder 407 outputs the syndrome signal 519 as "00h". The XOR circuit 412 which has received the syndrome signal 519 passes the inputted frame without any error correction.

As a result, the frames inputted to the FEC blocks 621–636 are outputted without a little delay and an FEC process.

Figure 21:
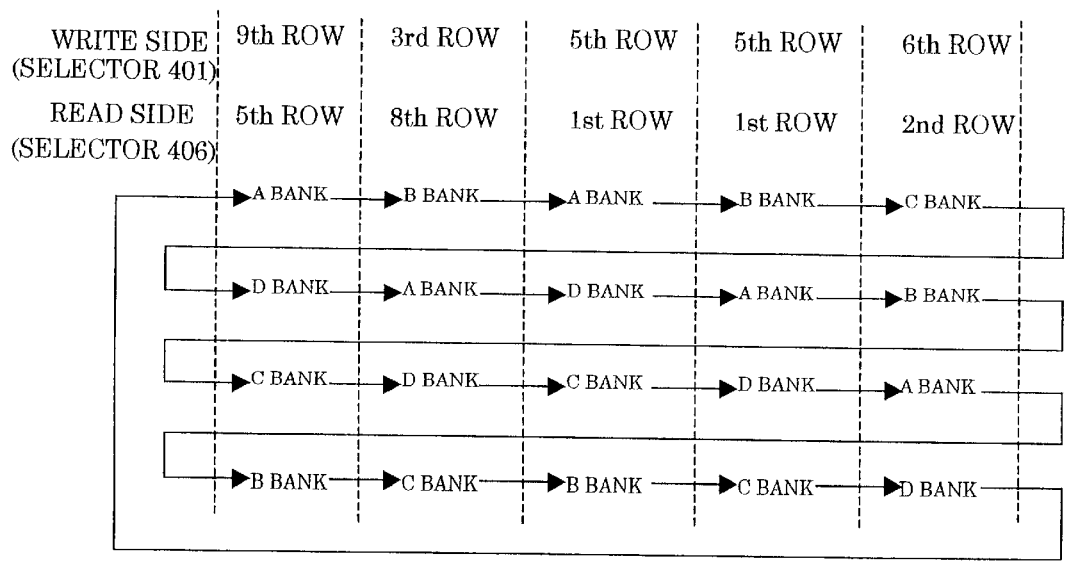
FIG. 21 is a diagram showing an example of bank switchover timings of syndrome registers provided on the receiver side in an error correcting method and an apparatus therefor according to the present invention.

FIG. 21 shows the order how the register selectors 401 and 406 shown in FIG. 18 switch over the banks of the syndrome registers 402–405. It is to be noted that in FIG. 21 the syndrome registers 402–405 are respectively supposed to be called A bank, B bank, C bank, and D bank registers.

Namely, the register selector 401 on the write side firstly selects the A bank register from the OH portion in the 9th row at the time T1, and then selects the B bank register from the OH portion in the 3rd row at the time T15. After selecting the A bank register from the OH portion in the 5th row at the time T5, the register selector 401 selects the B bank register from the payload portion in the 5th row at the time T18, and selects the C bank register from the OH portion in the 6th row at the time T25.

In the same way, the register selector 401 selects the register with the bank switchover of 20 times forming a single cycle in the order of D bank, A bank, D bank, A bank, B bank, C bank, . . . etc, at the times T35, T10, T39, T13, T24, T34 . . . etc.

The register selector 406 on the read side selects the A bank register at the times T6, T7, T8, and then selects the B bank register at the times T20, T21. After selecting the A bank register at the time T9, the register selector 406 selects the B bank register at the times T22, 23, and selects the C bank register at the time T30.

In the same way, the register selector 406 selects the register with the bank switchover of 20 times forming a single cycle in the order of D bank, A bank, D bank, A bank, B bank, C bank, . . . etc.

As a result, it becomes possible to store the input signal 521 without overlapping with the syndrome registers 402–405 for each bank.

FIGS. 22A and 22B show setting tables which the encoding setting means on the transmitter side and the decoding setting means on the receiver side respectively hold. Whether or not the FEC portions 30 and 40 start the operation is determined based on this setting table.

Figure 1:
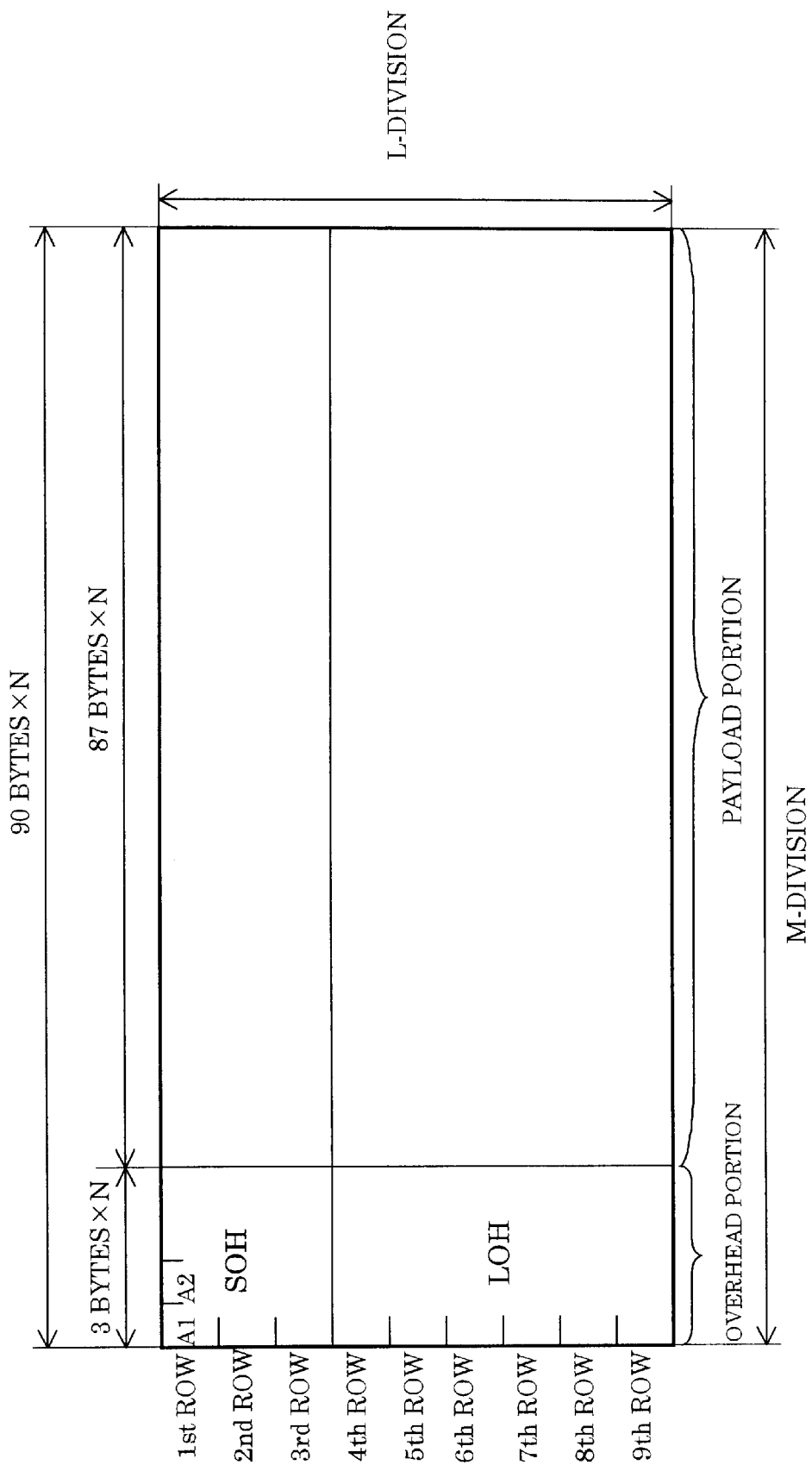
FIG. 1 is a diagram schematically showing an STS-N frame divided by an error correcting method and an apparatus therefor according to the present invention.

In FIG. 22A, when the FEC_DIS/EN signal 505 on the transmitter side shown in FIG. 16 indicates "0" i.e. "disable (DIS), the Z2 byte portion (see FIG. 1) of #6 is set to all "0" (in the North American regulations) or all "1" (in the CEPT regulations).

On the other hand, the FEC_DIS/EN signal 505 indicates "1" i.e. "enable (EN)", the Z2 byte portion of #6 is set to "AAh", where it is notified to the receiver side that a transmitting message is transmitted after performing the Hamming-encoding.

In FIG. 22B, when an externally forced start signal (not shown) indicates "1" which means a start, the FEC 40 on the receiver side shown in FIG. 18 performs the FEC operation. In addition, when the forced start signal is "0" which means a finish, the FEC_DIS/EN signal 502 is "1" which means enable (EN), and Z2 byte portion of #6 in the inputted STS-192 frame is anything but all "1" or "0", the FEC 40 on the receiver side shown in FIG. 18 performs the FEC operation.

The FEC portion 40 does not perform the FEC operation except the above cases.

As a result, it becomes possible to examine the apparatus compulsorily and decide whether or not the decoding on the receiver side should be performed based on the notification from the transmitter side.

As described above, an error correcting method and an apparatus therefor according to the present invention is arranged such that a frame regulated by the synchronous network is divided into L blocks in the direction of row, and preferably, information bits and check bits are allotted to a payload portion and non-defined bits of LOH portion, respectively, and further preferably, the information bits and the check bits arc divided into M sub blocks to form Hamming code blocks. Therefore, it becomes possible to decrease a transfer delay, to improve the BER and to small size the circuit.

In addition, an error correcting method and an apparatus therefor according to the present invention can be arranged such that a code error correcting means rearrange the each of the Hamming code blocks per bit. Therefore, it becomes possible to correct sequential M bit errors.

Moreover, an error correcting method and an apparatus therefor according to the present invention can be arranged such that a syndrome register with a plurality of banks operates an error syndrome of the Hamming code block, and based on the operation result, the code error correction of the Hamming code block is performed by a bank switchover. Therefore, it becomes possible to decrease the transfer delay further.

In addition, an error correcting method and an apparatus therefor according to the present invention can be arranged such that the syndrome register operates the check bits or the syndrome by repeating the determination of the output state at the time t+x in parallel from the information bits and the output state of x bits at the time t sequentially. Therefore, it becomes possible to secure the operation margin of LSI for an error correcting code.

FIG. 23 is a table comparing the BER logically obtained by the following equation depending on the existence of error correcting function (on/off) in the FEC portion.

$$P_{e.fec} = \frac{1}{k} * \sum_{e=2}^{n} E\{X(e)\} * \frac{n!}{e!(n-e)!} * P_e^e * (1-P_e)^{n-e} \quad \text{(Eq. 35)}$$

$$E\{X(e)\} = \begin{cases} 0, & e = 0 \text{ or } 1 \\ \frac{k-e}{n_p}*(e+1) + \frac{n_P-k}{n_P}*e + \frac{e}{n}*(e-1), & e > 1 \end{cases}$$

$P_{e.fec}$: BER AT FEC ON $P_e$ BER AT FEC OFF n: 25072 bit(SHORTED CODE LENGTH: length of codewords)

k: 25056 bit(INFORMATION BIT NUMBER: length of message block)

$n_P$: $2^{16}-1$(CODE LENGTH BEFORE SHORTENING: block size of the parent code)

Namely, when the FEC is made off, the BER indicates the BER value generated on the transmission line. On the contrary, when the FEC is made on, the BER indicates the calculated value of the BER when a single bit error correction and even error detection are performed. It is to be noted that this table indicates the calculation value when the shortened Hamming code blocks (n=25072 bits, k=25056 bits) are used.

When the generated BER value is $1\times10^{-3}$, $1\times10^{-4}$, ..., $1\times10^{-15}$ by the FEC function, the improved BER is $1.008\times10^{-3}$, $9.637\times10^{-5}$, ..., $2.509\times10^{-26}$, respectively. It is realized that the smaller the BER value of the channel becomes, the more effectively the BER improvement is made.

Accordingly, it becomes possible to decrease the generation frequency of switchover by an SD (the BER is $1\times10^{-5}$–$10^{-9}$).

What we claim is:

1. An error correcting method which uses a Hamming code for coding a K-row frame prescribed for a synchronous network, the frame having an overheard portion and a payload portion, where K is a natural number $\geq 2$, the method comprising the steps of:

dividing-the K-row frame into L Hamming code groups so that each of the Hamming code groups is composed of one or more rows of the frame, where L is a natural number satisfying $2 \leq L \leq K$;

allotting information bits by row in the payload portion of the frame and check bits to each of the Hamming code groups; and writing check bits corresponding to each Hamming code group to non-defined bits of only an LOH portion of the overhead portion.

2. The error correcting method as claimed in claim 1 wherein the synchronous network comprises SONET or SDH, and the frame comprises an STS-N frame, an OC-N frame, or an STM-N frame.

3. The error correcting method as claimed in claim 1 wherein the information bits and the check bits of each Hamming code group are further divided into M subblocks to compose a Hamming code block having a single subblock of the information bits and the check bits, where M is a natural number $\geq 2$.

4. The error correcting method as claimed in claim 3 wherein the information bits and the check bits are rearranged per bit over each of the Hamming code groups in order that an error correction of sequential M bits is made.

5. An error correcting apparatus which uses a Hamming code for coding a K-row frame prescribed for a synchronous network, the frame having an overheard portion and a payload portion, where K is a natural number $\geq 2$, the apparatus comprising:

a code error correcting means for dividing the K-row frame into L Hamming code groups so that each of the Hamming code groups is composed of one or more rows of the frame, where L is a natural number satisfying $2 \leq L \leq K$; and for allotting information bits by row in the payload portion of the frame to each of the Hamming code groups; and means for writing check bits corresponding to each Hamming code group to non-defined bits of only an LOH portion of the overhead portion.

6. The error correcting apparatus as claimed in claim 5 wherein the synchronous network comprises SONET or SDH, and the frame comprises an STS-N frame, an OC-N frame, or an STM-N frame.

7. The error correcting apparatus as claimed in claim 6 wherein the code error correcting means further include encoding setting means which designate a start and a finish of a Hamming-encoding on the transmitter side.

8. The error correcting apparatus as claimed in claim 7 wherein the encoding setting means set predetermined non-defined byte portion of an LOH portion to an eigen value when the start of the Hamming-encoding is designated, and sets the check bits to all "0" or all "1" when the finish thereof is designated.

9. The error correcting apparatus as claimed in claim 6 wherein the code error correcting means include decoding setting means which designate a start or a finish of decoding the Hamming code on the receiver side.

10. The error correcting apparatus as claimed in claim 9 wherein the decoding setting means include means for designating a start and a finish of decoding action with either a compulsory start or a compulsory finish, and starts a decoding action only when the designation is the compulsory start or the compulsory finish, the value of the check bits is neither all "1" nor all "0", and the predetermined non-defined byte portion of the LOH portion have an eigen value.

11. The error correcting apparatus as claimed in claim 6 wherein the code error correcting means include means for a BI9–Nx24 operation by B2 byte information of an LOH portion after Hamming-encoding a transmitting message.

12. The error correcting apparatus as claimed in claim 6 wherein the code error correcting means include means for a BIP-Nx24 operation by B2 byte information of an LOH portion after correcting the Hamming code error of a received message.

13. The error correcting apparatus as claimed in claim 5 wherein L is equal to 3 and K is equal to 9, and the code error correcting means divides the 9-row frame into 3 Hamming code groups and allots the information bits by rows of 9th, 1st, 2nd rows, 3rd–5th rows, 6th–8th rows in the payload portion to the Hamming code groups and writes the check bits of each Hamming code group to K1, D5 and Z2 byte portions, which are the non-defined bits in the LOH portion.

14. The error correcting apparatus as claimed in claim 13 wherein the code error correcting means divide the information bits and the check bits into M subblocks, where M is a natural number $\geq 2$ to generate the Hamming code groups having the Hamming code to compose a single subblock of the information bits and the check bits.

15. The error correcting apparatus as claimed in claim 14 wherein the code error correcting means include data exchanging means for rearranging the information bits and the check bits per bit over each of the Hamming code groups in order that an error correction of sequential M bits is made.

16. The error correcting apparatus as claimed in claim 14 wherein the code error correcting means include syndrome registers, composed of a plurality of banks, which divide a received Hamming code message per the Hamming code group, operate a syndrome of each Hamming code group, and make a code error correction of each Hamming code group based on the operation result by changing the banks.

17. The error correcting apparatus as claimed in claim 13 wherein the code error correcting means include syndrome registers which generate the check bits by sequentially inputting an information vector, the information vector formed of a sequential number of bits x of a transmitting message, and outputting states, in parallel, at a time t+x.

18. The error correcting apparatus as claimed in claim 13 wherein the code error correcting means include syndrome registers which operate a syndrome by sequentially inputting an information vector, the information vector formed of a sequential number of bits x of a received Hamming code message, and outputting states, in parallel, at a time t+x.

19. The error correcting apparatus as claimed in claim 13 wherein the code error correcting means include syndrome registers which can correct a single bit error of the received Hamming code message and detect an even bit error, and detecting means for outputting a single bit error correcting signal and an even bit error detecting signal.

* * * * *